United States Patent
Poimboeuf et al.

[19]

[11] Patent Number: 6,067,411
[45] Date of Patent: May 23, 2000

[54] ADAPTIVE FREQUENCY SYNTHESIZER WITH SYNCHRONIZATION

[75] Inventors: Michael K. Poimboeuf, San Mateo; Theodore A. Marsh, Millbrae; Danny T. Lee, San Francisco; Keith Kam Shun Lee, San Jose, all of Calif.

[73] Assignee: Sillicon Graphics, Inc., Mountain View, Calif.

[21] Appl. No.: 08/718,765

[22] Filed: Sep. 23, 1996

[51] Int. Cl.⁷ .................................................... G06F 1/12
[52] U.S. Cl. ............................ 395/551; 375/362; 395/807
[58] Field of Search .................................. 395/551, 806, 395/807, 556; 375/354, 362; 331/172; 327/291, 296

[56] References Cited

U.S. PATENT DOCUMENTS

| | | | |
|---|---|---|---|
| 5,473,274 | 12/1995 | Reilly et al. ............................... | 327/159 |
| 5,481,697 | 1/1996 | Mathews et al. ......................... | 395/556 |
| 5,534,939 | 7/1996 | Nakamura et al. ...................... | 348/505 |
| 5,546,434 | 8/1996 | Kalafatis ................................... | 375/376 |
| 5,668,830 | 9/1997 | Georgiou et al. .................... | 375/356 X |

FOREIGN PATENT DOCUMENTS

| | | | |
|---|---|---|---|
| 07107494 | 4/1995 | Japan ................................ | H04N 9/00 |
| 2116759 | 9/1983 | United Kingdom ............. | H03K 5/15 |

*Primary Examiner*—Thomas M. Heckler
*Attorney, Agent, or Firm*—Wagner, Murabito & Hao LLP

[57] ABSTRACT

The present invention pertains to a clock generator that provides a plurality of dock outputs, each of which can be synchronized from one of several possible sets of references. Multiple frequency synthesizers are used to generate the clocks at the desired frequencies. These frequency synthesizers operate on the principle of dividing a supplied reference dock by an integer (I), plus a ratio (R/M), whereby there are approximately I plus (R/M) input clock cycles per output clock cycle. The output of a frequency synthesizer is a train of pulses with its duration equal to the period of the reference clock and at a rate equal to $N/D = 1/(I+R/M)$ times the reference clock rate. In order to generate an output signal with a more uniform duty cycle, the pulse train drives a toggle select circuit. The function of the toggle select circuit is to remove half of the phase quantization due to the limited frequency resolution of the reference dock. This is accomplished by selecting between the rising edge output of the toggle versus a falling edge delayed version of that same signal.

21 Claims, 19 Drawing Sheets

ADAPTIVE FREQUENCY SYNTHESIZER WITH SYNCHRONIZATION

FIELD OF THE INVENTION

The present invention pertains to a frequency synthesizer that has the capability of generating a plurality of clock signals at desired frequencies with an extremely high degree of accuracy with jitter reduction mechanism and which is capable of being synchronized to a media stream.

BACKGROUND OF THE INVENTION

With the advent of multimedia applications, computers now have the capability of accepting and handling data in a wide variety of different representations ranging from audio to video and even realistic three-dimensional graphics information. There are countless numbers of applications involving the mixture of audio, video, and graphics, such as real-time simulations, video teleconferencing, Internet-related activities, computer games, telecommuting, virtual reality, etc. The reason behind the proliferation of multimedia applications is due to the fact that much more information can be conveyed and readily comprehended with pictures and sounds rather than with text or numbers. Indeed, a picture is worth a thousand words. Besides enhanced user interface, computers are increasing being used to generate the media itself as a finished product. For example, powerful workstations are often utilized in movie studios to provide special effects for movies or computer animated films. Recording studios often use sophisticated computers for the production of professional quality CD's, tapes, and soundtracks.

However, the added degree of complexity for the design of such computer systems is tremendous. One problem which must be overcome relates to that of synchronization. Many different streams of media data (media streams) may need to be synchronized together, while otherwise operating at independent nominal rates, and at the same time other media streams in the same system might need to remain independent. Further, events in the computer system may need to be synchronized to other events in the system, at the same time that others in the same system might need to remain independent. Finally, media and events may need to be synchronized together with great precision in order to preserve existing or create new temporal correlation between those rates. for instance: video and audio media streams within the same production must generally be synchronized; and multiple tracks of audio from a single musical program must be synchronized. There are several different video formats, each of which has its own specified rate. Likewise, audio and graphics data may take different formats and rates (e.g., compact disk, digital audio tape, MPEG compressed, etc.). Unless there is some mechanism for synchronizing all of these different rates, the acquisition, manipulation, and playback of video, audio, and graphics would be disjointed and uncoordinated. For instance, video and audio clips having the same nominal durations, but based on non-isochronous time bases may need to be aligned and synchronized so that they can be presented simultaneously with temporal correlation between video events and corresponding audio sounds. Synchronization is required to match the audio with the video so that they both have the same duration even though they have different underlying data rates. Not only does synchronization match respective lengths, but it also provides proper alignment. In the past, clapboards were used in motion pictures in order to ensure that the soundtrack was correctly aligned with the film. With proper alignment, the sound of an explosion occurs at the same time as the display of a gunshot. Thus, synchronization must also provide for proper alignment of the various data running at different rates.

In the prior art, a common method for providing synchronization was to tie everything to a single "master" dock signal. All of the "slave" devices were referenced to running off this master clock signal via hardware or software based phase locked loops. Hence, most professional film editing/production facilities utilize dedicated, specialized and sometimes custom cables, routing, and interfacing for providing high-precision "house" synchronization.

These clock signals define the sample rate of the media stream. Clock synthesizers are typically used to provide the clock signals. Prior art audio dock synthesizers typically use a pair of cascaded multiplying phase lock loop structures for direct synthesis of a single audio dock signal based upon a black burst type video dock input signal. Audio dock signals, generated by these prior art audio clock synthesizers, typically lock to an NTSC or PAL rate video signal. There are several disadvantages associated with these prior art audio clock synthesizers. First, they are generally limited to a few discrete frequencies, or ratios of frequencies. Second, they are difficult to adjust via software control without interruption of the media stream flow, or modification of the media stream content in the form of sample rate conversion; In the case of analog PLL based synthesizers, they are subject to noise susceptibility, and long lock times; NEED MORE HERE.

Therefore, there is a demand for an advanced frequency synthesizer for use in synchronizing different data streams. The present invention provides a novel frequency synthesizer that is efficient, adjustable, and highly accurate. In addition, the frequency synthesizer of the present invention has the capability of generating multiple dock signals at desired frequencies which can be adjusted to meet stringent tolerances imposed by professional digital media requirements. With the present invention, multiple devices operating at different rates are synchronized precisely.

SUMMARY OF THE INVENTION

The present invention pertains to a clock generator that provides a plurality of clock outputs, each of which can be synchronized to one of several possible sets of references. Multiple frequency synthesizers are used to generate the clocks at the desired frequencies. These frequency synthesizers operate on the principle of dividing a supplied reference clock by the quantity (I+(R/M) input clock cycles per output clock transition.

The edges of these frequency synthesizer output are quantized to edges of the reference clock. In order to generate an output signal with an improved jitter characteristic, that is, a more uniform duty cycle, the output from the frequency synthesizer drives a jitter reduction mechanism. The function of the toggle select circuit is to remove half of the phase quantization due to the limited frequency resolution of the reference clock. This is accomplished by selecting between the direct output of the toggle flip-flop and a version of the same signal that has been delayed by one half of a reference clock period.

It is also desired to maintain a precise ratio between the frequency output of a particular frequency synthesizer and a system synchronization signal. The system synchronization signal typically transitions at a video at a video horizontal line rate.

A measurement apparatus very similar in form to the frequency synthesizer measures the difference between the system synchronization signal's nominal and actual rate in terms of the reference clock and passes that information to a frequency synthesizer. The frequency synthesizer uses that information to modify the output of the frequency synthesizer so that an exact rational relationship between the frequency of the system synchronization signal and the frequency of the synthesizer output is maintained.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

In the following description, for purposes of explanation, numerous specific details are set forth in order to provide a thorough understanding of the present invention. It will be obvious, however, to one skilled in the art that the present invention may be practiced without these specific details. In other instances, well-known structures and devices are shown in block diagram form in order to avoid obscuring the present invention.

Figure 1:
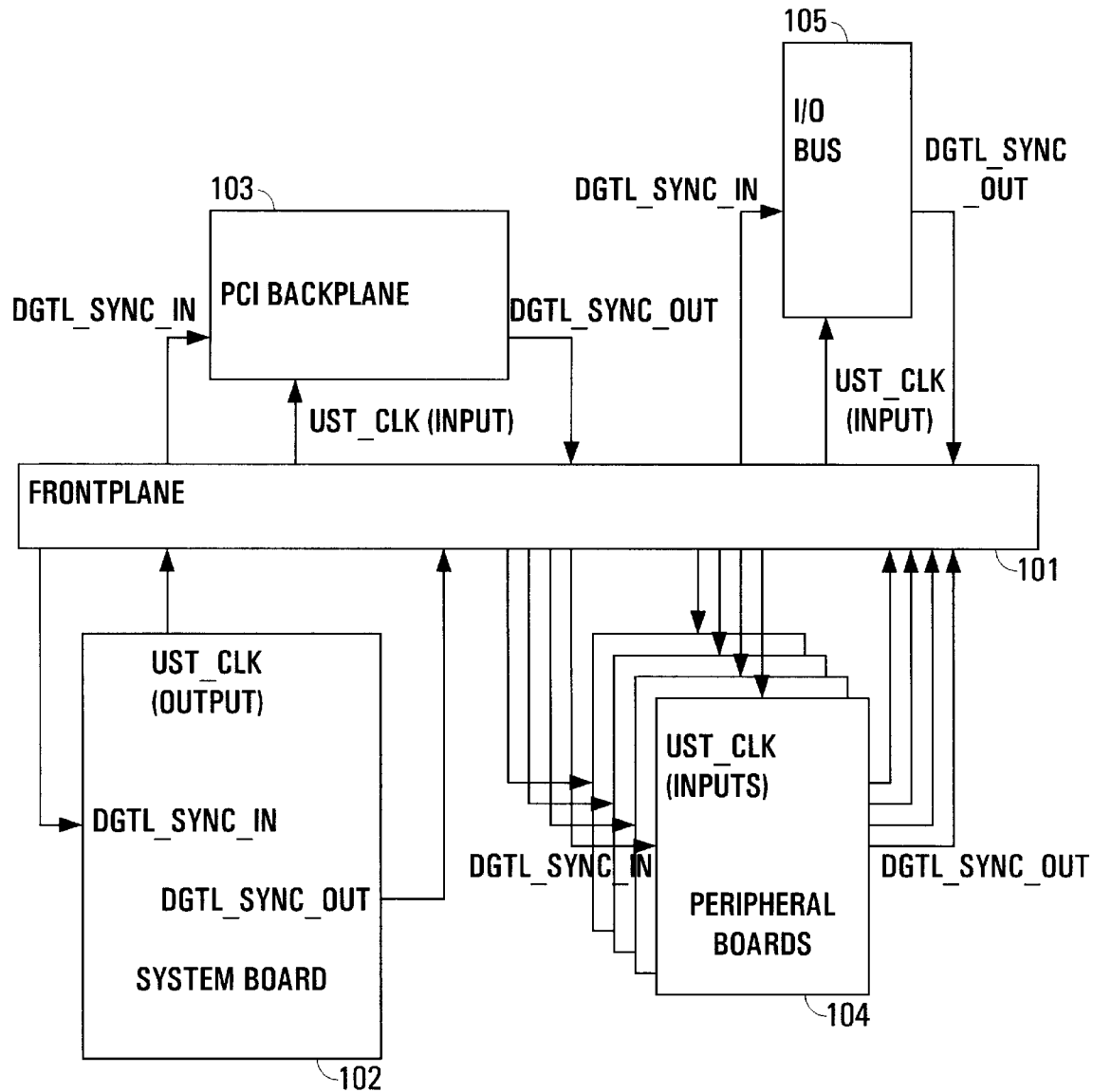
FIG. 1 shows a block diagram of the currently preferred embodiment of a computer system upon which the synchronization signal distribution of the present invention may be practiced.

Referring to FIG. 1, a block diagram of the currently preferred embodiment of a computer system upon which the synchronization signal distribution of the present invention may be practiced is shown. In this embodiment, the computer system is comprised of several interconnected printed circuit boards: a front plane 101, a system board 102, a backplane 103, peripheral boards 104, and an external I/O board 105. The frontplane 101 is connected to each of the other boards and contains the necessary routing resources and buses for transmitting the various data, control, and dock signals to any of the IC chips. Frontplane 101 also contains packet switching controller circuitry. The system board 102, also referred to as the "mother" board, is the main board and contains the microprocessors or central processing units and any supporting chips. A PCI backplane 103 is used to support standard PCI devices so that these off-the-shelf devices may be coupled to the computer system. Additional subsystems may be incorporated by plugging in a number of peripheral boards 104. Finally, an external I/O bus 105 is used so that the computer system may be coupled to another computer system or to a larger computer network.

Basically, three signals are used to provide synchronization: UST_CLK, DGTL_SYNC_IN, and DGTL_SYNC_OUT. These signals are low voltage LVTRL and high/rising edge active. Furthermore, all of these sync signals are point-to-point interconnections. Intraboard connections to multiple chips are made through a daisy chain topology. These three sync signals are buffered and distributed locally on a PCI bus via the PCI backplane as three signals per each PCI board that is coupled to the computer system. The System Board 102 is the primary source of the UST_CLK signal (UST—Unadjusted System Time). Alternatively, another computer system may supply an equivalent UST_CLK signal to be accepted by the present computer system. The UST_CLK signal is a clock signal that corresponds to a uniform, monotonically increasing timeline. Thereby, all of the programs and media streams can be referenced to this UST_CLK signal, which provides a common, Unadjusted System Time. In contrast, the DTGL_SYNC_IN signal is a synchronization signal based on video timing. It is delivered as a buffered input to all of the computer's subsystems (e.g., audio, video, graphics, etc.), including system boards. For example, the DTGL_SYNC_IN signal is input from the frontplane 101 to each of the System Board 102, PCI backplane 103, Peripheral Boards 104, and I/O Bus 105. Correspondingly, the DTGL_SYNC_OUT signal can be generated by any of the subsystems (e.g., System Board 102, PCI backplane 103, Peripheral Boards 104, and I/O Bus 105). The selection of which subsystem is enabled to generate the DGTL_SYNC_OUT signal is via software control. The DTGL_SYNC_OUT signal, which is generated by one of the subsystems 102–105, acts as the DTGL_SYNC_IN signal to the rest of the subsystems. Each of these three sync signals are described in detail below.

Figure 2:
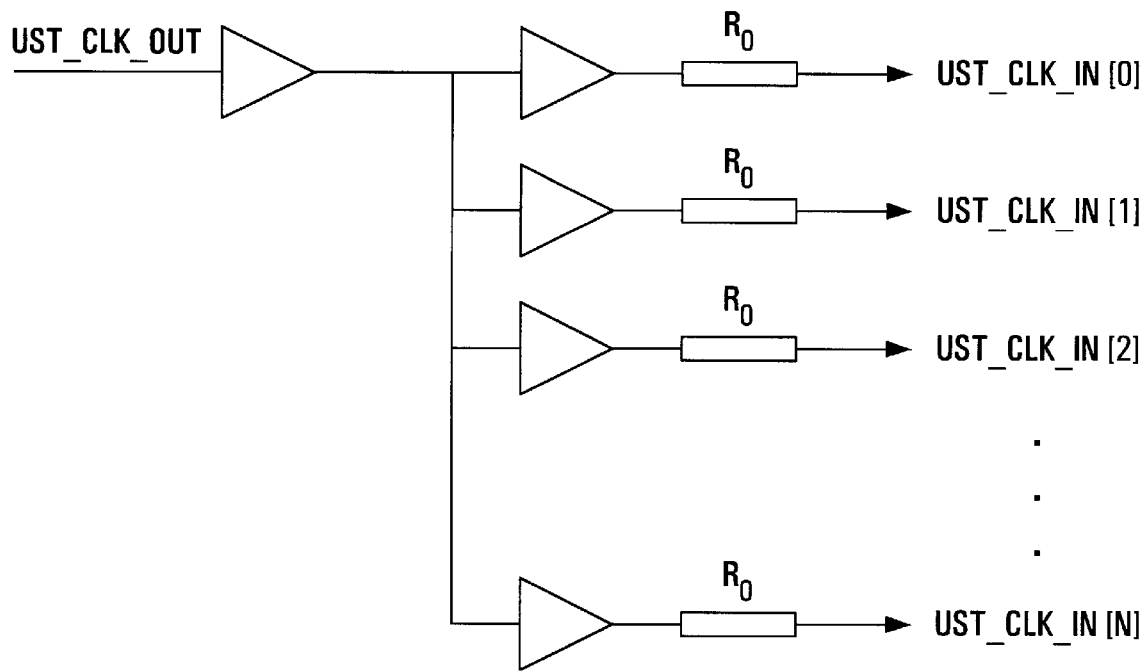
FIG. 2 shows the currently preferred UST_CLK frontplane buffer topology.

FIG. 2 shows the currently preferred UST_CLK frontplane buffer topology. It should be noted that the UST_CLK signal is driven from a single source. Inputs are pulled-up to 3.3 volts with terminations of 4.7K to 10K ohms. Outputs are series terminated with 33 to 47 ohms. These series terminations, when combined with the output impedance of the drives (e.g., 8 ohms), match the characteristic impedance Ro of the printed circuit board (e.g., 55 ohms). Note that the UST_CLK signal may either be sourced from the system board or from a global dock in a distributed system.

Operations in system software can assume monotonically increasing UST counter values based on system time. The UST_CLK signal is a nominal 50% duty cycle asynchronously gated dock. The rate of the UST_CLK is set so that there are an integer number of nanoseconds per clock period. This convention is used in order to ease the software task of calculating "real" time versus Unadjusted System Time. Hence, UST_CLK rates are discussed in terms of clock period instead of frequency. Time periods in the following examples are relative to system time. Periods are specified in nanoseconds relative to system time. Thus, the frequency tolerance on these rates depends on, and is equal to the relative frequency tolerance of the system clocks. The preferred nominal UST_CLK period in this embodiment is approximately equal to one microsecond. The minimum recommended period of UST_CLK is 240 nanoseconds. The maximum recommended period of UST_CLK is 5,000 nanoseconds, corresponding to a frequency of 200 KHz. This minimum is based upon a resolution of a 20 microsecond audio sample period with at least four UST_CLK periods. There is no absolute low frequency limit, but UST_CLK rates slower than 200 KHz may compromise performance.

Figure 3A:
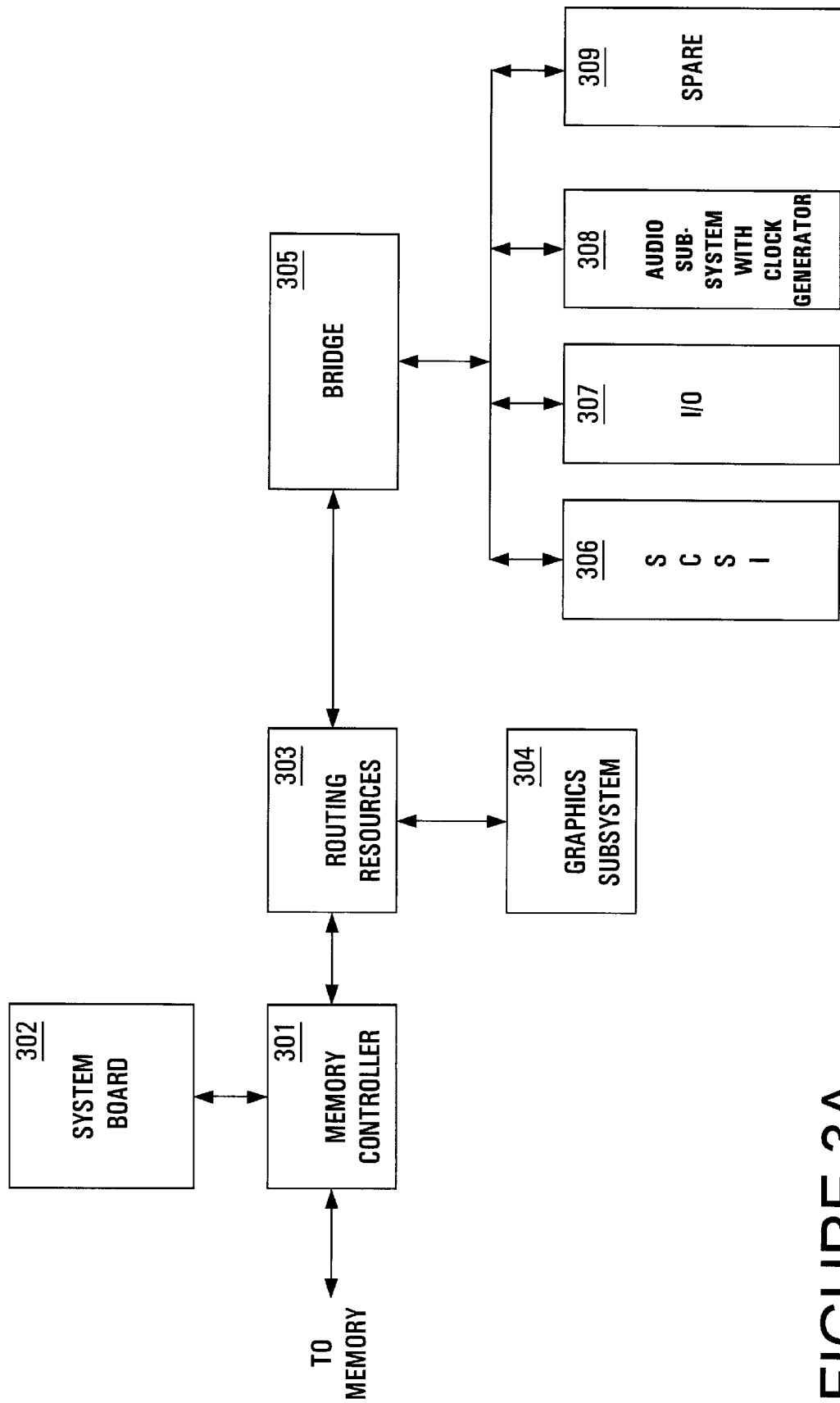
FIG. 3A shows an architectural block diagram of the functional units within a computer system upon which the present invention may be practiced.

FIG. 3A shows an architectural block diagram of the functional units within a computer system upon which the present invention may be practiced.

A memory controller 301 is used for accessing data to/from memory (e.g., DRAM, ROM, external cache, etc.). The memory controller is connected to the system board 302, which contains the CPUs. A switching matrix, bus architecture, or equivalent routing scheme 303 is implemented to route the data, control, and clock signals to various subsystems, such as graphics subsystem 304.

A bridge device 305 may be coupled to the routing resources block 303 to provide interconnection with other boards, such as SCSI board 306, I/O interface 307, clock generator 308, as well as additional spares 309. A packet-switched communications protocol is established for directing how packets of data are to be sent amongst the various components. The routing resources 303, memory controller 301, bridge 305, and dock generator 308 devices use phase-lock-loops to generate derivatives of the 400 MHz communications protocol dock. The UST_CLK signal is held inactive (LOW) disabled while all media cards are reset through the bridge 305. This reset can be either a PCI_RESET or a reset through the UST control register. Once all media cards are reset, the clock is enabled to start all UST counters at the same time. Since UST_CLK is asynchronously gated, it is resynchronized (double clocked) within the clock domain of the receiving device. Next, it is run through a debouncer which uses two PCI_CLK cycles of UST_CLK low followed by two PCI_CLK cycles of UST_CLK high to increment the UST counter.

Figure 3B:
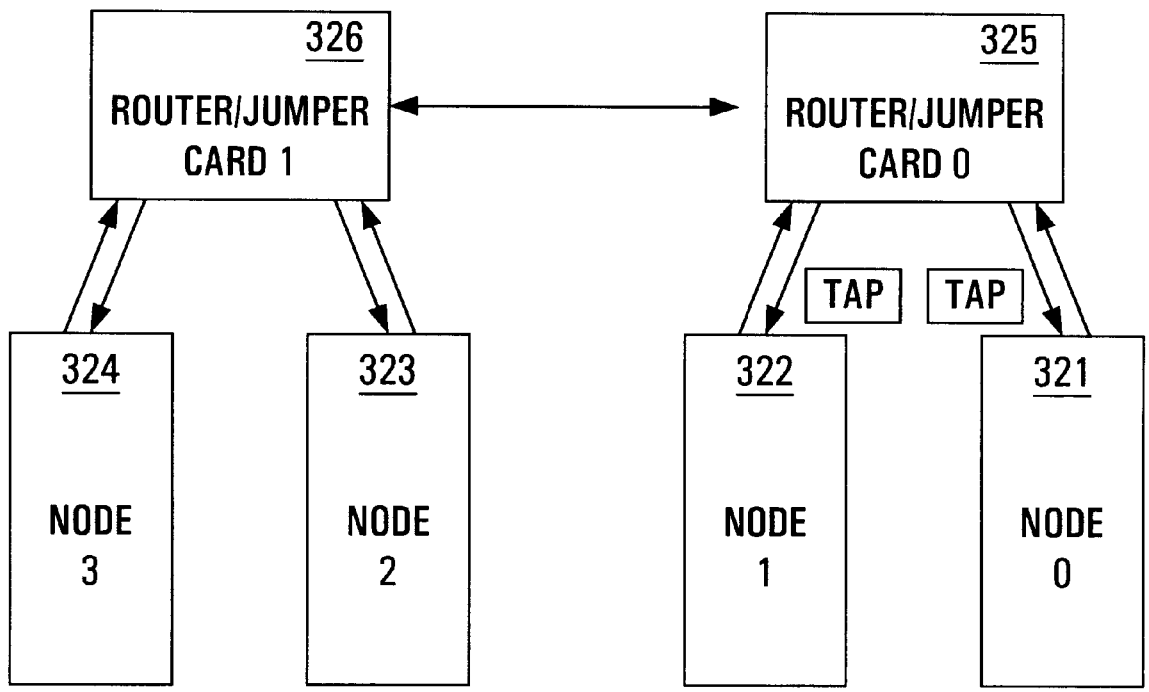
FIG. 3B shows how the present invention may be used in those circumstances having multiple nodes or computers.

It should be noted that the present invention may be applied to traditional LAN/WAN and client-server computer networks as well as to the multiple nodes of a distributed computer architecture. FIG. 3B shows how the present invention may be used in those circumstances having multiple nodes or computers. Four nodes 321–324 are connected to two router/jumpers 325–326. The UST_CLK signal is generated by one of the nodes 321–324. This UST_CLK signal is then input to its local router/jumper for distribution to local nodes. The local router/jumper also distributes the UST_CLK signal to remote or external router/jumpers. In turn, these remote router/jumpers distributes the UST_CLK signal to their respective nodes. Similarly, the DIGTIAL_SYNC signal is generated by a selected video source on one of the nodes. This DIGITAL_SYNC signal is distributed to all other nodes with subsystems desiring to sync with the video reference. These signals must be level translated and terminated in order to operate properly.

Figure 3C:
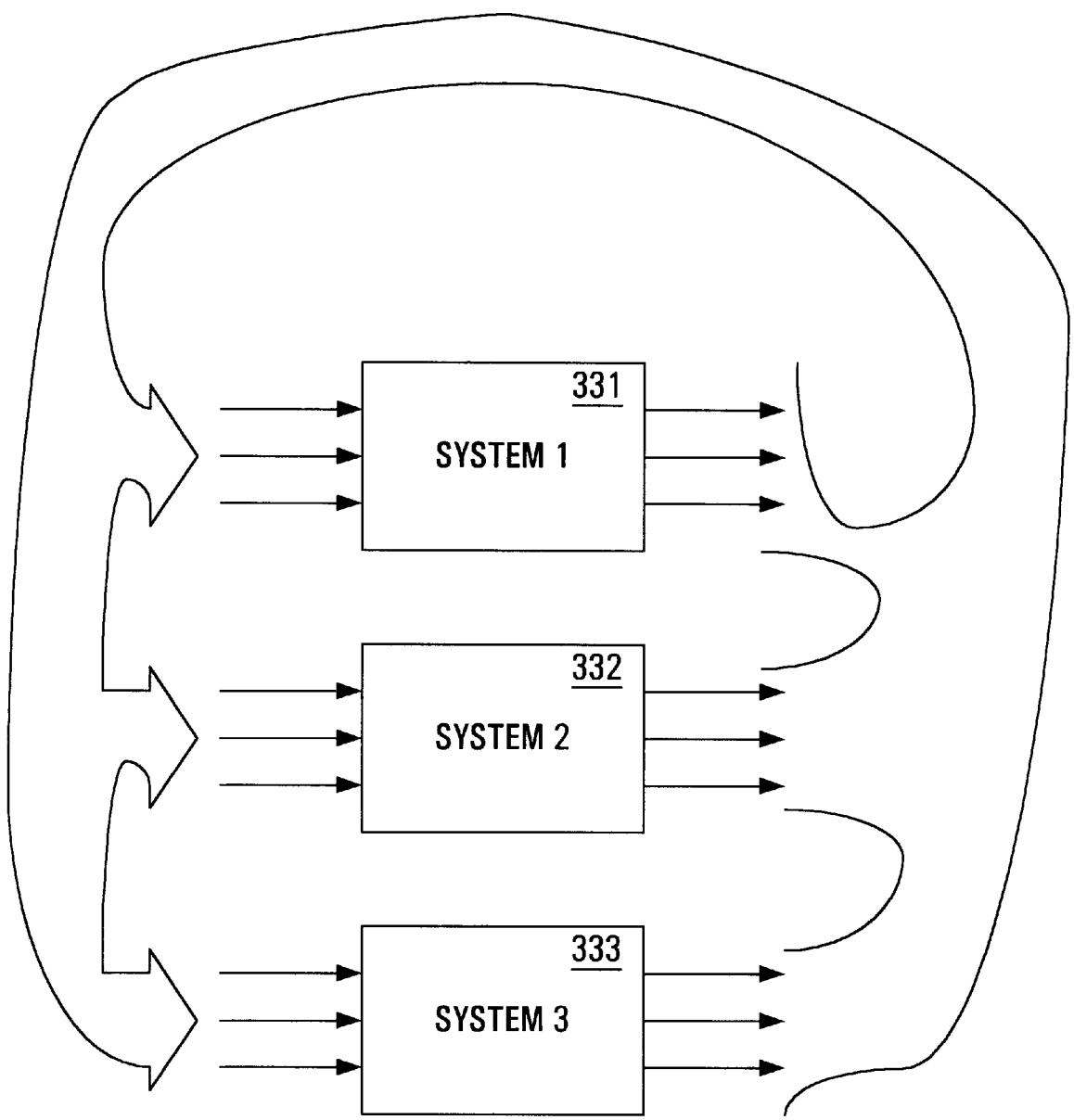
FIG. 3C is a diagram showing a multitude of media and serial streams as may be synchronized by the present invention.

FIG. 3C is a diagram showing a multitude of generic media and serial streams as may be synchronized by the present invention. Any number of various media, serial, and/or digital streams are fed into a number of systems 331–333. These inputs can be synchronized in frequency and in time to either the UST, MSC, or to both. Examples of different types of such streams include, but are not limited to: MIDI, audio, video, graphics, EEE 1394, VITC, LTC, WWV radio, etc.

Figure 4:
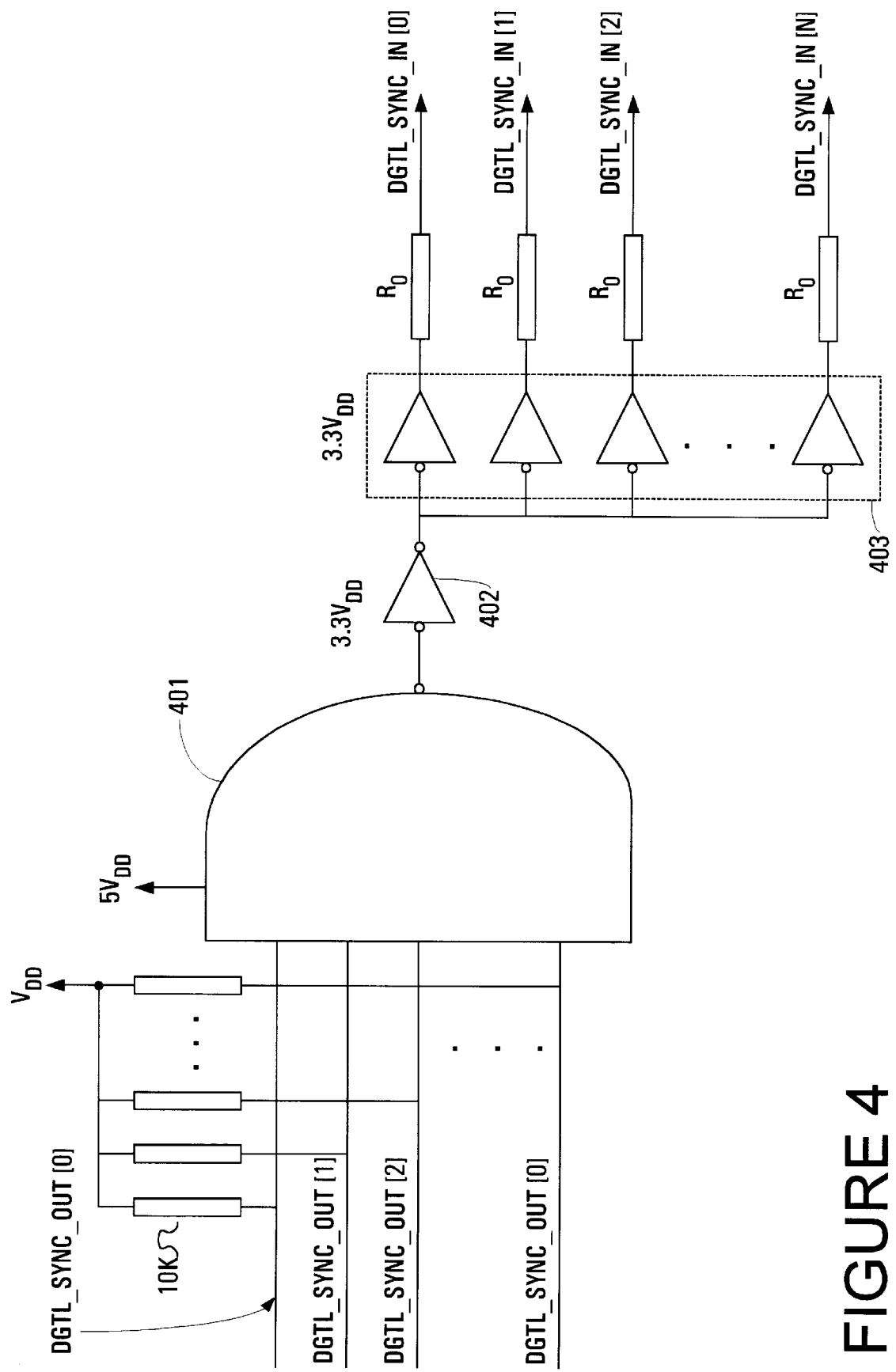
FIG. 4 shows the currently preferred DGTL_SYNC distribution buffer topology.

FIG. 4 shows the currently preferred DGTL_SYNC distribution buffer topology. The DGTL_SYNC_OUT signals are input to a combinational AND gate 401. They are pulled-up to 3.3 volts with terminations of 4.7K to 10K ohms.

The output from AND gate 301 is buffered by a non-inverting buffer 402 in order to provide level translation from 5 V TTL to 3 V LVTTL. Next, a number of drivers 403 are used to drive the DGTL_SYNC_OUT signals. The outputs are series terminated with 33 to 47 ohms. These series terminations, when combined with the output impedance of the drives (e.g., 8 ohms), matches the characteristic impedance $R_0$ of the printed circuit board (e.g., 55 ohms).

The DTGL_SYNC signals are modulated from a nominal 50% duty cycle 25% duty cycle coincident with the rising edge of even field vertical to 25% duty cycle coincident with the rising edge of even field vertical synchronization, and 75% duty cycle coincident with the rising edge of odd field vertical synchronization. Devices can sense NTSC versus PAL timing by counting the number of lines between 25%/75% DTGL_SYNC_IN clocks. A count of 525 corresponds to NTSC, whereas a count of 625 corresponds to PAL timing. Duty cycles of 25%/50%/75% can be detected with downcounters running at the internal clock rate of the detecting circuitry.

Figure 5:
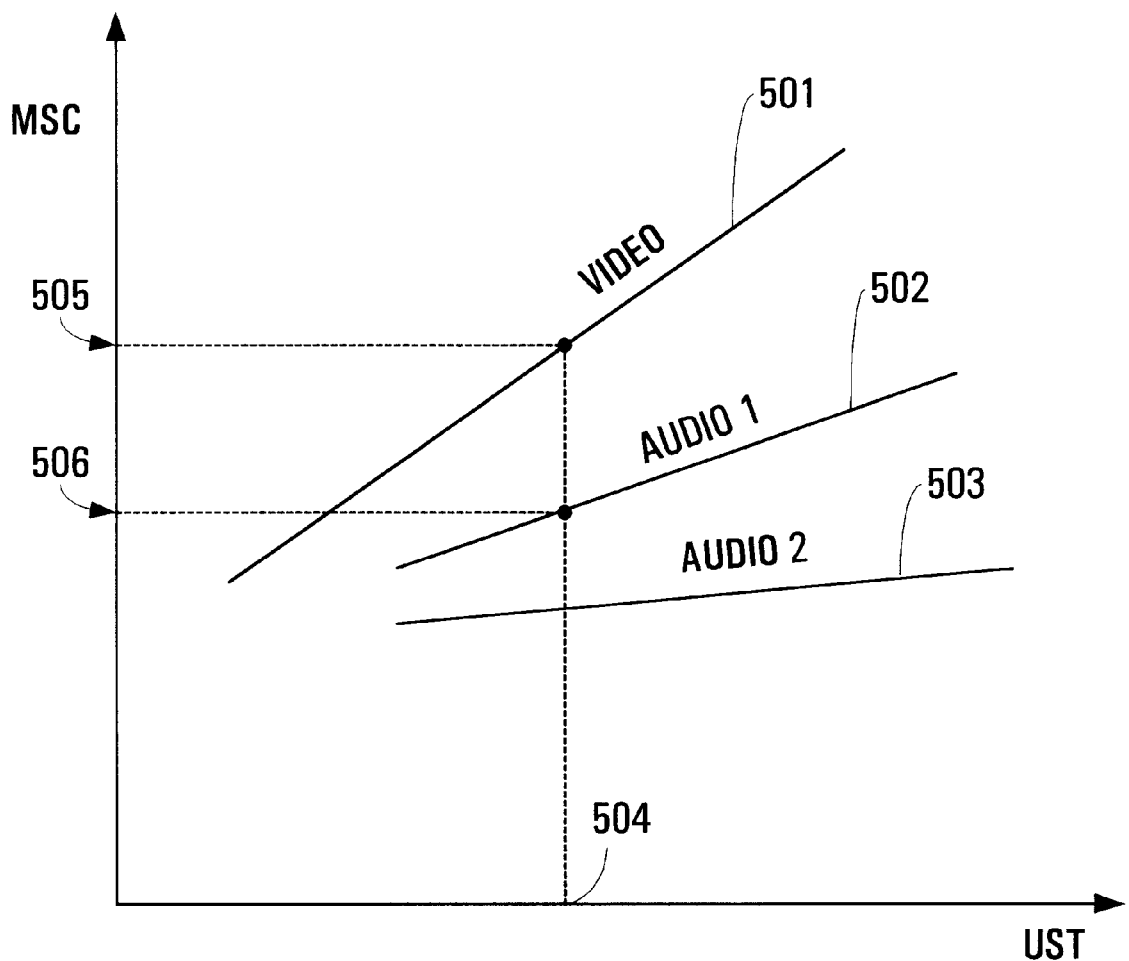
FIG. 5 shows a graph of three streams of data: a video stream, a first audio stream, and a second audio stream.

FIG. 5 shows a graph of three media streams of data: a video stream 501, a first audio stream 502, and a second audio stream 503. These media streams are plotted as a function of the UST value versus their individual media stream counter (MSC) values. The MSC value represents a sequential count of sample frames of media data. For example, video stream 501 might be operating at an update rate of 50 fields per second. Whereas, the first audio stream 502 might correspond to a stereo left/right audio signal having a rate of 48,000 samples per second. Likewise, the third audio stream 503 might have a slightly slower sample rate. The sample rates of each data stream are given by their respective slopes, whereby the steeper the slope, the faster their sampling rate. Hence, the goal then is to determine, for any given time interval, which particular sample of a specific data stream line is to be accessed. The present invention provides an infrastructure for delivering precise MSC, and UST timing, which is used for determining how MSC is related to UST so that differing data streams may be manipulated to become synchronized. For the most recently processed samples, the count of those samples in MSC units are determined and aligned with the appropriate UST time interval. Thereby, the CPU can now be used to resolve how to capture and output data streams so that the data streams are properly synchronized and aligned. For example, at UST time 504, the system should display the video frame corresponding to MSC count 505 and output via the speakers, the audio sample corresponding to MSC count 506. It should be noted that this process also applies to input signals so that the corresponding UST time during which input data is being captured can be determined. For instance, in capturing a multimedia file, the audio samples are recorded according to the same UST times as that of the video samples. As a result, both media streams can be aligned during playback. The present embodiment of the invention provides UST/MSC time alignment, MSC/MSC frequency lock, and the combination of the two.

Figure 6:
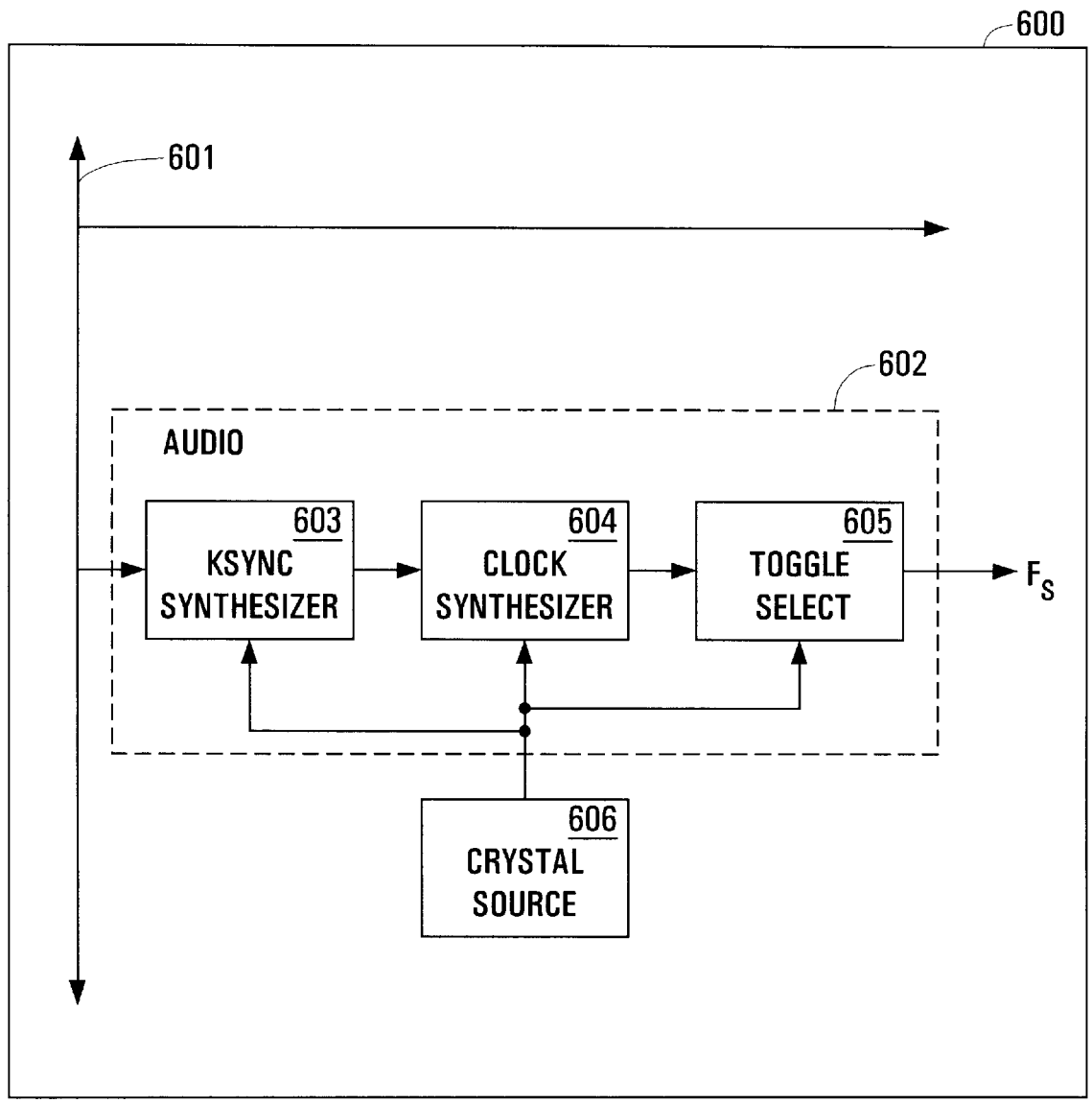
FIG. 6 shows a portion of a workstation that contains the synchronization "backbone" which is comprised of the UST_CLK, DGTL_SYNC_IN, and DGTL_SYNC_OUT synchronization signals.

FIG. 6 shows a portion of a workstation 600 that contains the synchronization "backbone" 601 which is comprised of the UST_CLK, DGTL_SYNC_IN, and DTGL_SYNC_OUT synchronization signals described above. An audio synchronization circuit 602 is coupled onto this synchronization backbone 601. Circuit 602 generates an audio output sample rate, Fs, so that it is synchronized to a particular video rate. This is accomplish by implementing a clock synthesizer block 604. Clock synthesizer 604 has the capability of outputting a wide range of clock speeds with extremely fine resolution. The different clock speeds are derived as a function of a much higher frequency dock generated by a crystal dock source 606. For instance, the specified audio rate for compact disks is 44.1 kHz. This 44.1 kHz audio rate can be generated by the clock synthesizer 604. Moreover, dock synthesizer 604 has the ability to generate dock rates that are close to 44.1 kHz (e.g., 43.9 kHz, 44.0 kHz, 44.2 kHz, 44.3 kHz, etc.).

The KSYNC synthesizer block 603 slows down or speeds up the audio dock rate of the clock synthesizer 604, depending on the video rate. The KSYNC synthesizer block 603 measures the video time versus the crystal clock time and adjusts its values accordingly. More particularly, the KSYNC synthesizer block 603 accurately determines the number of crystal clock cycles that should occur for each video line and adjusts the clock synthesizer 604 so that it generates his exact number. The number of crystal clock cycles is calculated based on the observation that the ratio of the number of crystal dock cycles over the period of a DIGITAL_SYNC signal (e.g., a video horizontal event) should be equal to the ratio of the crystal dock over sampling factor times the audio clock rate over the horizontal lines per second. In the present embodiment, the crystal clock oversampling factor is $2^{11}$, or 2048. Higher crystal clock oversampling will yield higher precision. For example, if the video rate happens to be running 10% faster, then the KSYNC synthesizer block 603 controls the dock synthesizer 604 so that it outputs 10% more audio dock cycles than nominal. In other words, the KSYNC synthesizer block 603 adjusts the audio sampling rate, $F_s$, according to variation of the video rate by lengthening or shortening the period of the output clock with respect to the nominal period. Optionally, a toggle select block 605 may be implemented in order to reduce the jitter in dock edges. This toggle select block is also known as a jitter reduction mechanism. It yields a more precise output audio clock signal with improved resolution. There are a number of different ways by which the KSYNC synthesizer block 603, dock synthesizer 604, and toggle select 605 can be implemented. Furthermore, Fs can be scaled throughout the system by multipliers which are typically integer powers of 2, i.e., $2^{**}n$ where n is a positive integer.

Figure 7:
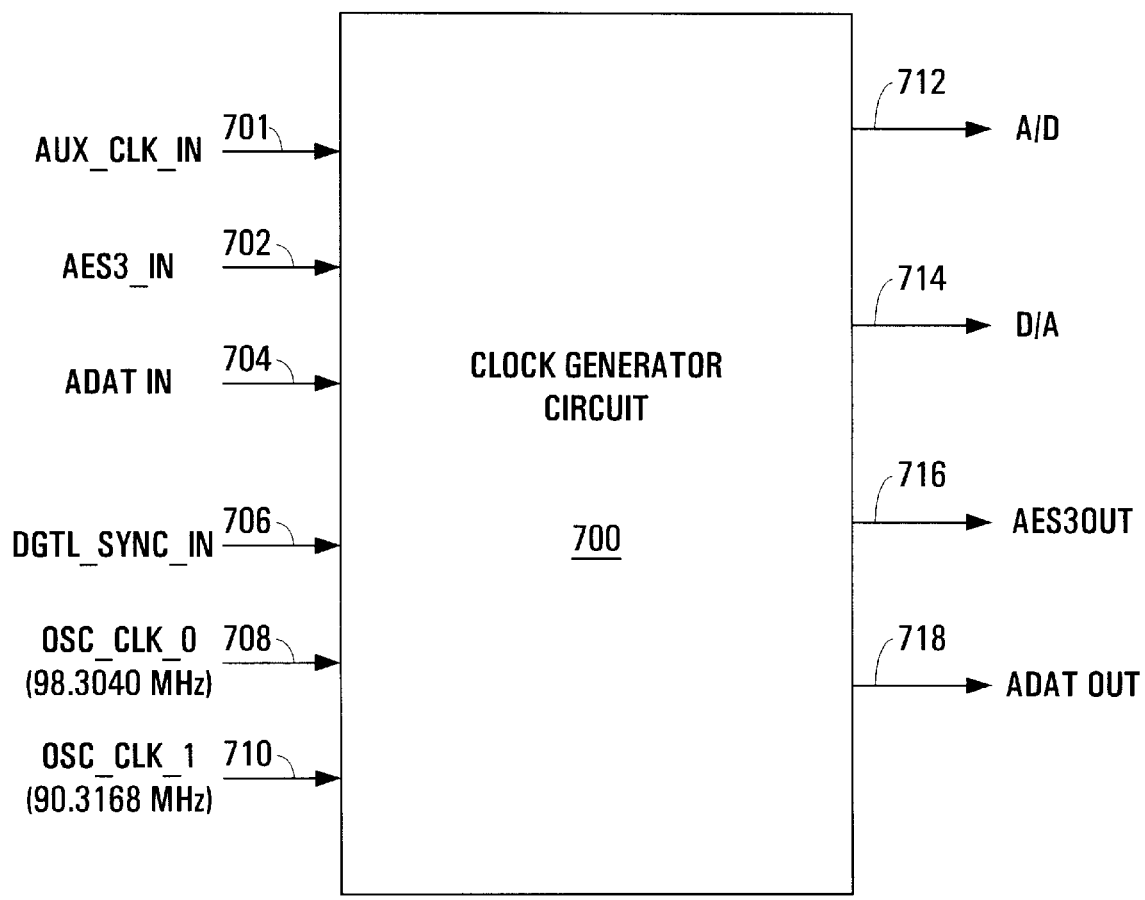
FIG. 7 Shows an input output diagram of an exemplary clock generator according to the present invention.

With reference to FIG. 7, an input/output diagram is shown of an exemplary clock generator circuit 700 according to the present invention. The clock generator circuit 700 receives a multiplicity of input clock signals. In an embodiment of the present invention, the clock generator circuit 700 receives audio and video input dock signals from media sources. The exemplary dock generator circuit 700 generates output audio clock signals with frequencies which are on average, a precise rational fraction of input clock signal frequencies. The exemplary clock generator 700 generates an audio output sample rate, $F_s$, which may or may not be enabled to be synchronized to the DTGL_SYNC_IN video rate, the selection of which is accomplished by software means. The exemplary clock generator 700 has the capability of outputting a wide range of clock speeds with extremely fine frequency resolution and high precision. The different clock speeds are derived as a function of typically much higher reference frequency clock signals including oscillator dock input signals, auxiliary clock input signals, and AES and ADAT audio input clock signals. For example, the specified audio rate for compact disks is 44.1 KHz. This 44.1 KHz audio rate can be generated by the dock generator 700. Moreover, the clock generator 700 has the ability to generate clock rates that are close to 44.1 KHz (e.g., 44.099 KHz, 44.101 KHz, 44.056 KHz, etc.). A pair of digital synchronization synthesizers 810, 812 (shown in figure. 8) slow down or speed up the dock rate of any of the four FIRM frequency dock synthesizers 840, 842, 844, 846 depending on the DIGITAL_SYNC_IN video rate. It should be noted that DIGITAL_SYNC, video synchronization, and KSYNC all refer to the same signal. A functional relationship between the digital synchronization synthesizers 810, 812 and the four FIRM frequency clock synthesizers 840, 842, 844, 846 provides precise synchronization as is described below. The dock generator circuit 700 can be implemented on an integrated circuit which also includes a media stream counter (MSC) and a UST_CLK wherein the system timing for the integrated circuit is derived from a PCI1 clock.

With reference still to FIG. 7, clock input signals are provided to the clock generator 700 via reference clock inputs. Clock inputs include an auxiliary clock input bus 701, an AES clock input 702, an ADAT clock input 704, a DTGL_SYNC_IN clock input 706, a first oscillator clock input 708, and a second oscillator clock input 710. The clock input signals provide reference clock sources to the clock generator circuit 700 for generating clock output signals according to methods of the present invention which are described below.

A pair of auxiliary clock input signals are provided to the auxiliary clock input bus 701 which includes two lines. The auxiliary clock input signals can include clock input signals from a media stream or from a crystal oscillator or from any other source. An ADAT (Alesis digital audio tape standards) input dock signal is provided to the ADAT dock input 704. In a preferred embodiment of the present invention, the ADAT input clock signal runs at 256× (256 multiplied by a base rate). The maximum frequency of the ADAT input clock signal is 12.8 MHz. An AES 3(Audio Engineering Society standards) input clock signal is provided to the AES3 dock input 702. In a preferred embodiment of the present invention, the AES3 digital input clock signal can be an AES3, AES11, or IEC958 type digital input signal. In a preferred embodiment of the present invention, the AES3 input clock signal runs at 256× (256 multiplied by a base rate) the audio sample frame rate. The DTGL_SYNC_IN input 706 is coupled to receive the DTGL_SYNC_IN input signal of FIG. 1. As discussed, the DGTL_SYNC_IN input signal provides a video timing synchronization signal for all media streams input to the clock generator circuit 700. A first oscillator clock input signal, OSC_CLK_0, is provided to the first oscillator clock input 708. A second oscillator clock input signal, OSC_CLK1, is provided to the second oscillator clock input 710. In a preferred embodiment of the present invention the first and second oscillator clock input signals, OSC_CLK_0 and OSC_CLK_1, are derived respectively from first and second free running crystal oscillators. In an alternative embodiment of the present invention, the oscillator clock input signals, OSC_CLK_0 and OSC_CLK_1, can be a black burst composite sync or SMPTE-S17.46 digital sync. Each of the oscillator clock inputs 708, 710 can accommodate frequencies of up to 102.4 MHz. The nominal operating frequency of the first oscillator dock input signal, OSC_CLK_1, is precisely 98.3040 MHZ=48.0 KHZ*2048. Tis value is equal to 2048×48 KHz which is a standard EEE 1394 clock rate. The nominal operating frequency of the second oscillator dock input, OSC_CLK 0, is precisely 90.3168 MHZ (=44.1 KZ*2048). This value is equal to 2048×44.1 KH wherein 44.1 KHz is the compact disk (CD) audio clock rate.

Clock output signals from the exemplary clock generator 700 are provided via clock outputs to four different audio interfaces. Clock outputs include an analog to digital (A/D) output 712, a digital to analog (D/A) output 714, an AES output 716, and an ADAT output 718. The A/D output 712 provides an output dock signal to an analog to digital (A/D) converter interface (not shown). The D/A output 714 provides an output clock signal to a digital to analog (D/A) converter interface (not shown). The AES output 716 provides an AES3 output dock signal to an AES3 type interface. The ADAT output 718 provides a digital output clock signal to an ADAT type interface. An internal circuit block diagram is shown of the exemplary clock generator circuit 700 according to the present invention.

Figure 8:
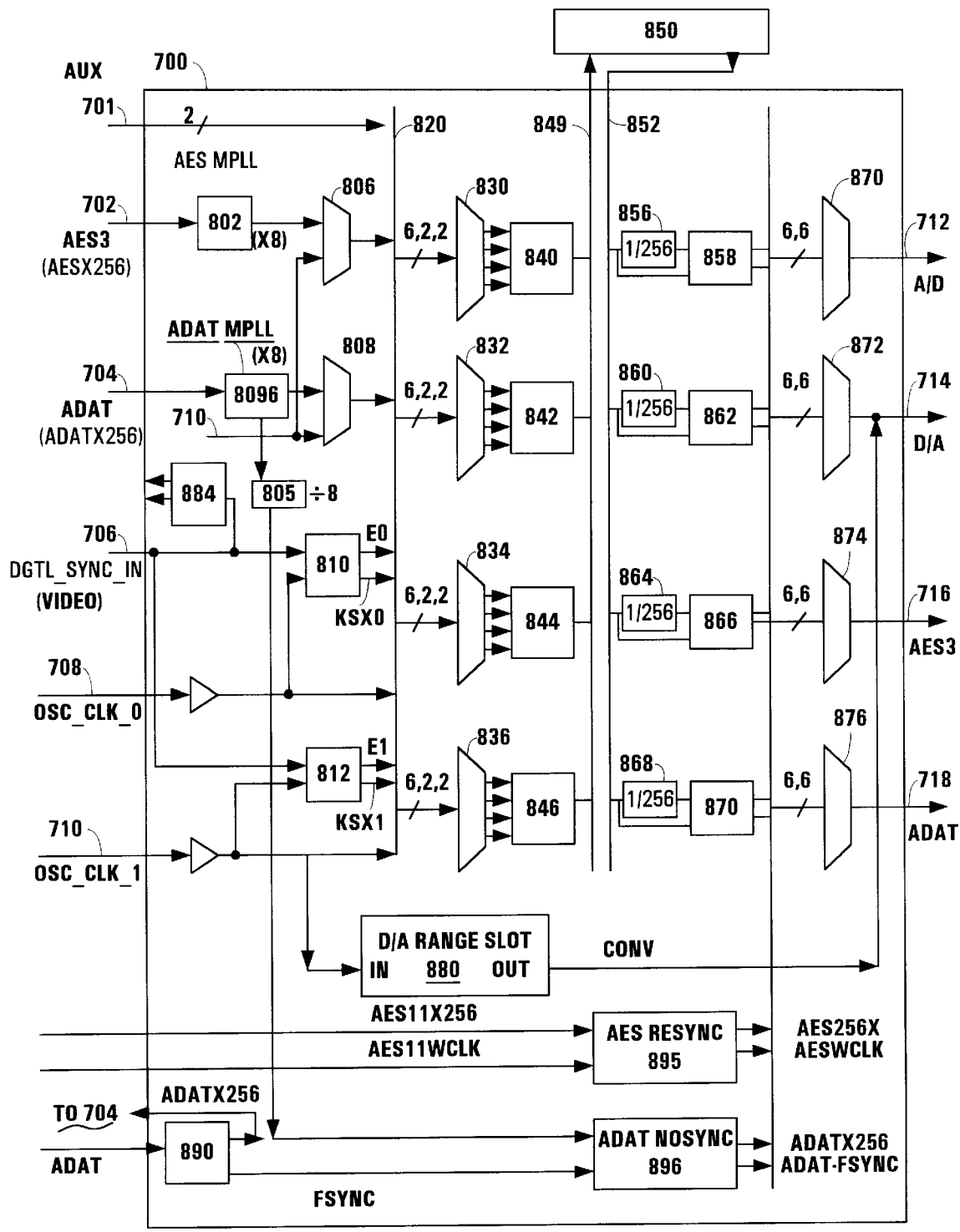
FIG. 8 shows an internal circuit block diagram of an exemplary dock generator which includes multiple frequency synthesizes according to the present invention.

FIG. 8 shows the clock inputs 701, 702, 704, 706, 708, and 710 described above in reference to FIG. 7. FIG. 8 also shows the clock outputs 712, 714, 716, and 718 described above in reference to FIG. 7. An AES master clock phase lock loop (AES MPLL) 802 is coupled to receive the AES input clock signal via the AES input bus 702. The AES MPLL 802 provides 8× frequency multiplication. Since the AES input dock signal provided to the input of the AES MPLL 802 runs at 256× (256 multiplied by a base rate), the output of the AES MPLL 802 runs at 2048× (2048× multiplied by the base rate). The output of the AES MPLL 802 provides the frequency multiplied AES dock signal to a first input of a first PLL multiplexer (first PLL MUX) 806. The first PLL MUX 806 also includes a second input which is coupled to receive the second oscillator clock input signal, OSC_CLK_1 (90.3168 MHz) via the second oscillator clock input 710. The first PLL MUX 806 provides a first reference signal, $F_{R1}$, to a master clock select bus 820. The first PLL MUX 806 is primarily used in a failure mode capacity. If the AES MPLL 802 fails to lock to the AES dock input signal, then the first PLL MUX 806 provides the master clock select bus 820 with the second oscillator clock input signal, OSC_CLK_1.

An ADAT demodulator 890 is coupled to receive and demodulate an ADAT dock signal. The ADAT demodulator 890 demodulates the ADAT signal and provides the ADAT input clock signal to the ADAT input dock bus 704. The ADAT input dock bus 704 is coupled to provide the ADAT input dock signal to an ADAT master dock phase lock loop (ADAT MPLL) 804. The ADAT MPLL 804 provides 8× frequency multiplication. Since the ADAT input clock signal provided to the input of the ADAT MPLL 804 runs at 256× (256 multiplied by a base rate), the output of the ADAT MPLL 804 runs at 2048× (2048× multiplied by the base rate). The ADAT MPLL 804 provides an output signal to a first input to a second PLL multiplexer (second PLL MUX) 808. The second PLL MUX 808 also includes a second input which is coupled to receive the second oscillator clock input signal, OSC_CLK_1.

The second PLL MUX 808 provides a second reference signal, $F_{R2}$, to the master dock select bus 820. The second PLL MUX 808 is primarily used in a failure mode capacity. If the ADAT MPLL 804 fails to lock to the ADAT input dock signal, then the second PLL MUX 808 provides the master clock select bus 820 with a reference signal, $F_{R2}$, equal to the second oscillator clock input signal, OSC_CLK_1. If the ADAT MPLL 804 locks to the ADAT input dock signal, then the second PLL MUX 808 provides the master dock select bus 820 with a reference signal, $F_{R2}$, equal to the multiplied ADAT input dock signal. The ADAT MPLL 804 provides jitter attenuation for the ADAT input clock signal. The output reference signals, $F_{R1}$ and $F_{R2}$, of the MPLLs 802, 804 are provided to a master clock select bus 820. The AES MPLL 802 and ADAT MPLL 804 are further described below.

The first video synchronization synthesizer 810 includes a first input which is coupled to receive the DGTL_SYNC_IN input signal (FIG. 1) via the DTGL_SYNC_IN input 706. The first video synchronization synthesizer 810 also includes a second input which is coupled to receive the first oscillator clock input signal, OSC_CLK_0. A first output of the first video synchronization synthesizer 810 is coupled to provide a first synchronization error value, $E_0$, to the master clock select bus 820. The DGTL_SYNC_IN signal includes a horizontal video synchronization signal (horizontal synchronization signal) which is detected at the input of the first video synchronization synthesizer 810. Registers in the first video synchronization synthesizer 810 are loaded with values representative of the expected number of OSC_CLK_0 periods within a time period measured between rising edges of the horizontal synchronization signal. Counters in the first video synchronization synthesizer 810 count the number of OSC_CLK_0 periods within a time period measured between rising edges of the horizontal synchronization signal. The first synchronization error value, $E_0$, is representative of a difference between measured and nominal values representative of the number of OSC_CLK_0 periods per horizontal synchronization signal period. The first synchronization error value, $E_0$, can be received and used for error correction purposes in by FIRM frequency synthesizers 840, 842, 844, and 846. A second output of the first video synchronization synthesizer 810 is coupled to provide a KSX1 signal to the master clock select bus 820. The KSX1 signal is a control signal which runs at the DGTL_SYNC_IN clock rate. The KSX1 signal is used to enable a FIRM frequency synthesizer to execute error correction as explained below.

A second video synchronization synthesizer 812 includes a first input which is coupled to receive the DTGL_SYNC_IN input signal (FIG. 1) via he DGTL_SYNC_IN input 706. The second video synchronization synthesizer 812 also includes a second input which is coupled to receive the second oscillator clock input signal, OSC_CLK_1. In a preferred embodiment of the present invention, a buffer is used to buffer the second oscillator clock input signal, OSC_CLK_1, before OSC_CLK_1 is provided to the second input of the second video synchronization synthesizer 812. The OSC_CLKφ is also similarly buffered. A first output of the second video synchronization synthesizer 812 provides a second synchronization error value, E1, to the master clock select bus 820. Registers in the second video synchronization synthesizer 812 are loaded with values representative of the expected number of OSC_CLK_1 periods within a time period measured between rising edges of the horizontal synchronization signal. Counters in the second video synchronization synthesizer 812 count the number of OSC_CLK_1 periods within a time period measured between rising edges of the horizontal synchronization signal. The second synchronization error value, $E_1$, is representative of the difference between the measured and nominal values representative of the number of OSC_CLK_1 periods per horizontal synchronization signal period. The second synchronization error value, $E_1$, can be received and used for error correction purposes by the FIRM frequency synthesizers. A second output of the second video synchronization synthesizer 812 is coupled to provide a KSX1 signal to the master clock select bus 820. The KSX1 signal is a control signal which runs at the DGTL_SYNC_IN clock rate. The KSX1 signal is used to enable a FIRM frequency synthesizer to execute error correction as explained below. A more detailed discussion of the first and second video synchronization synthesizers 810, 812 is presented below.

The master clock select bus 820 is coupled to receive six master dock reference signals including: the first and second reference signals, $F_{R1}$ and $F_{R2}$, transmitted from outputs of the first and second PLL MUX's 806, 808; the first oscillator dock input signal, OSC_CLK_0; the second oscillator clock input signal, OSC_CLK_1; the first auxiliary dock input signal; and the second auxiliary dock input signal. The first synchronization error value, E0, the second synchronization error value, E1, KSX0, and KSX1 are also provided to the master clock select bus 820.

Reference and output clock sets each consist of one or two signals. A frame dock takes the form of a word clock (WCLK) in all cases except for ADAT in which case, the frame clock takes the form of a frame synchronizer (FSYNCH). The frame dock runs at an audio sample rate (e.g., 48 KHz, 44.1 KHz, 32 KHz, etc.). The master clock select bus 820 is coupled to provide the master clock reference signals to four master dock select multiplexers 830, 832, 834, and 836. In a preferred embodiment of the present invention, each of the master dock select multiplexers 830, 832, 834, 836 is coupled to the master clock select bus 820 via a (6,2,2) bus. The master dock select multiplexers 830, 832, 834, 836 select from the above described master dock reference signals provided to the master dock select bus 820.

Each of the master dock select multiplexers 830, 832, 834, 836 drives a FIRM frequency synthesizer according to the present invention. Each of four FIRM frequency synthesizers 840, 842, 844, 846 includes four FIRM input buses. The first master clock select multiplexer 830 provides four FIRM input signals to the first FIRM frequency synthesizer 840. The second master clock select multiplexer 832 provides four FIRM input signals to the second FIRM frequency synthesizer 842. The third master clock select multiplexer 834 provides four FIRM input signals to the third FIRM frequency synthesizer 844. The fourth master clock select multiplexer 836 provides four FIRM input signals to the fourth FIRM frequency synthesizer 846. The four FIRM input signals are comprised of:

1] 1 of 6 master dock sources (MPLLO, MPLLI, AUX_CLK_O, AUX_CLK_1, OSC_CLK_φ, and USC_CLK_0)
2], 3] KSXn, which follows the selection of OSC_CLK_N
4] EC_EN which indicates a state of the max (830,832, 834,836)

The following Table shows how the FIRM adapts the period/frequency as a function of DTGL_SYNC:

|  |  | FIRM adapts by |  |
| --- | --- | --- | --- |
| DGT_SNC | epsilon | period | frequency |
| long (slow) | − | ↑ | ↓ |
| short (fast) | + | ↓ | ↑ |

With reference still to FIG. 8, a first and second input to each of the FIRM frequency synthesizers 840, 842, 844, 846 can receive one of the first and second synchronization error value pairs (EO,KSXO) and (E1, KSX1). The KSX signals run at the DGTL_SYNC_IN clock rate. The KSX signals are used to enable the FIRM frequency synthesizer to execute error correction. A third input to each of the FIRM frequency synthesizers 840, 842, 844, 846 receives an error correction enable signal, EC_EN. A fourth input to each of the FIRM frequency synthesizers 840, 842, 844, 846 receives a reference frequency signal from one of six master clock reference sources which include OSC_CLK_0, OSC_CLK_1, AUX_CLK_0, AUX_CLK_1, the first reference frequency signal, $F_{R1}$ (from the first PLL MUX 806), and the second reference signal, $F_{R2}$ (from the second PLL MUX 808).

If the synchronization error value (received by a FIRM frequency synthesizer 840, 842, 844, 846) is less than zero, then the DGTL_SYNC_IN signal has been determined by one of the video synchronization synthesizers 810, 812 to be running slow. In this case, the FIRM frequency synthesizer 840, 842, 844, 846 can be enabled to respond by lengthening the output clock period (with respect to the nominal period) of the FIRM frequency synthesizer 840, 842, 844, 846. If the synchronization error value (received by a FIRM frequency synthesizer 840, 842, 844, 846) is greater than zero, then the received DGTL_SYNC_IN signal has been determined by one of the video synchronization synthesizers 810, 812 to be running fast. In this case, the FIRM frequency synthesizer 840, 842, 844, 846 can be enabled to respond by shortening the FIRM output clock period (with respect to the nominal period) of the FIRM frequency synthesizer 840, 842, 844, 846. Each of the four FIRM frequency synthesizers 840, 842, 844, 846 is coupled to provide a FIRM output signal to a smoothing phase lock loop input bus (SPLL input bus) 849. An external smoothing phase lock loop (external SPLL) circuit 850 has an input which is coupled to receive a FIRM output signal via the SPLL input bus 849. The external SPLL circuit 850 is a phase lock loop locked to a voltage controlled crystal oscillator. The external SPLL circuit 850 provides time domain filtering in order to output high precision jitter free professional clock rates to a word dock bus (WCLK bus) 852.

The WCLK bus 852 drives four word dock divider circuits each comprised of a WCLK divider and a clock resynchronization block according to the present invention. The WCLK dividers 856,860,864,870 provide framing of each audio sample signal in order to provide direct memory access (DMA) to computer readable memory units in the computer system of FIG. 3. The WCLK dividers 856,860, 864, 870 generate 1× frequencies ($F_S/256$) based upon 256× sample dock frequency inputs. The clock resynchronization blocks 858, 862, 866, 868 are used to resynchronize the WCLK signal to the falling edge of the related 256× clock. Each of the six 256×/1× clock pairs leading to the output select multiplexers comes from one of these blocks. Two of these blocks resynchronize the WCLK of ADAT and AES to their respective 256× clocks. This resynchronization is required to take up skew introduced by the MPLL jitter attenuator, in the case of ADAT, and external skew combined with receiver skew in the case of AES. Since both of these blocks resynchronize to the falling edge of the 256× dock, these blocks introduce a 1/512 sample delay (40.7 ns @ 48 KHz) to both docks.

Four output select multiplexers 870,872, 874, 876 select an appropriate 256× dock/WCLK word clock pair for each interface. There are six pairs to choose from. All outputs use a 256× oversampled dock and a WCLK word clock. The only "receiver" using clock generator clocks is the A to D. It uses a 256× oversampled dock so that it can run frequency synchronous with other physical interfaces. Note that the D/A output 714 has a CONV dock applied to it. A digital-to-analog range (D/A) range select frequency synthesizer block 880 provides a conversion clock signal to the D/A output bus 714. This dock signal is in the range from 512× to 1024× the conversion frequency (i.e. 2× to 4× the 256× sample dock). This sample dock is asynchronous to the other D/A clocks. The purpose of this clock is to provide a fixed, non-jittered, free running reference for a PLL internal to a digital to analog converter which is coupled to receive the D/A clock output signal via the D/A output bus 714. Note that the free running frequency of the conversion clock signal, output from the (D/A) range select frequency synthesizer block 880, can be changed dynamically by modifying a SelRange [4:0]. The 512× to 1024× ratios are min/max limits of the range for this clock. The dynamic behavior of the digital to analog changing CONV clock values is equivalent to the dynamic PLL performance of the AD1859 for jittered WCLK inputs.

With reference still to FIG. 8, a video synchronization detector 884 allows software to determine the video rate of an input clock signal received. The video synchronization detector 884 is coupled to receive the DGTL_SYNC_N input signal (FIG. 1) via the DTGL_SYNC_IN input 706. The video synchronization detector 884 generates two signals; an ODD_Field and EVEN_Field. When an ODD_Field event is detected, ODD_Field is high for one PCI_CLK cycle. When an EVEN_Field event is detected, EVEN_Field is high for one PCI_CLK cycle. When no event is detected, both inputs stay low. These two bits are reported in the Status DMA and used by software to determine whether the DGTL_SYNC_IN input signal is in PAL (Phase Alternating Line) format or in NTSC (National Television Standards Committee) format. The following is a definition of the events detected: EVEN_Field_Event: 20% to 30% DTGL_SYNC_IN duty cycle NO_Event: 45% to 55% DTGL_SYNC_IN duty cycle ODD_Field_Event: 70% to 80% DGTL_SYNC_IN duty cycle The implementation of the video synchronization detector 884 includes a twelve-bit counter which is incremented when DTGL_SYNC_IN input signal is high, decremented when the DGTL_SYNC_IN input signal is low, and cleared at the start of each DGTL_SYNC_IN input signal period. At the end of each DGTL_SYNC_IN input signal period, the value left in the counter is decoded to determine whether a field event was detected. A PCI_CLK is used to dock this counter. Though the video synchronization detector 884 was designed to work with NTSC and PAL video standards (where the period of DGTL_SYNC_IN is approximately 64 us), the actual range of DGTL_SYNC_IN input signal periods, where the video synchronization detector 884 will work properly, is 40 us to 100 us. The EVEN_Field and ODD_Field bits are reported in a status DMA, which can occur once every 0.5 ms. A report of '1' indicates that the respective field event has been detected since the previous status DMA. Each status DMA, as a whole, has a UST value associated with it. A PAL video reference can be detected by software measuring the UST distance between successive EVEN_Field (or ODD_Field) events to be approximately 40 ms (=1/(25 Hz)). An NTSC video reference can be detected by software measuring the UST distance between successive EVEN_Field (or ODD_Field) events to be approximately 33 ms [=1001/(30 Hz *1000)].

With reference to FIG. 8, the FIRM (Integer +Reminder/Modulus) frequency synthesizers 840, 842, 844, 846 work on the principle of dividing a reference clock by an integer (I), plus a ratio (R/M), such that there are, on average, precisely I plus R/M input clock cycles per output clock transition. The FIRM frequency synthesizers 840, 842,844, 846 are programmed by software to have a set of values in registers which are easily derived from I,R, M, the FIRM frequency synthesizers 840, 842, 844, 846 generate output clock signals whose transitions are quantized to the edges of the reference clock, and at a rate equal to N/D=1/(I+R/M) times the reference dock rate. To create a output with better jitter characteristics, this pulse train can drive a toggle select apparatus. The output of this apparatus leads to the final synthesizer output.

Figure 9A:
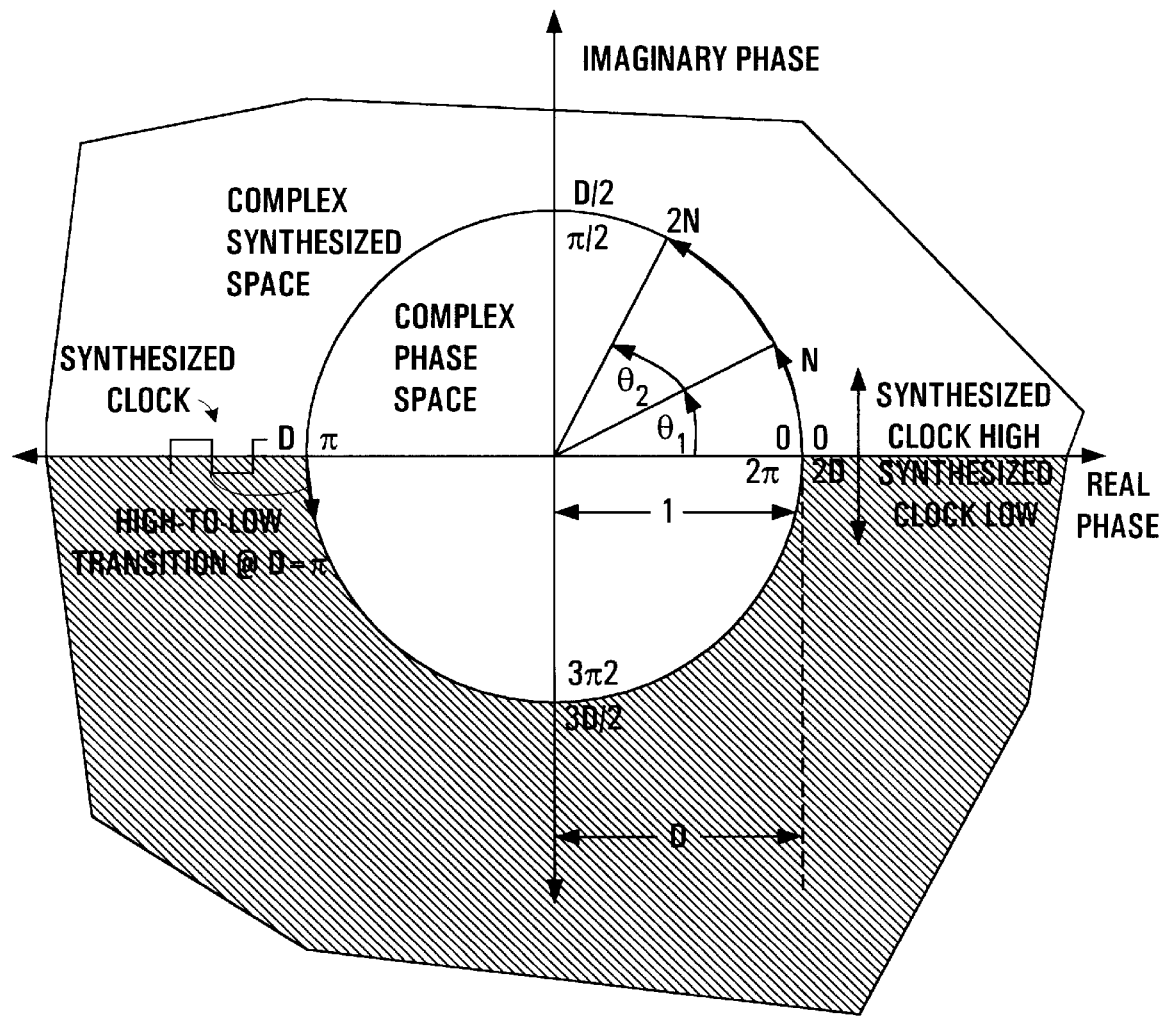
FIG. 9A shows a mapping in the complex phase/synthesis domain between a numerator, N, and a denominator, D, versus a phase increment.

FIG. 9A shows a mapping in the complex phase/synthesis domain between N, D, the phase increment n, and the radian period between transitions, π. Relationship (1), below, expresses this mapping.

$$N=>_n, D=>\pi \tag{1}$$

A unary ratio of N & 2D, is defined as a ratio in which N and 2D share an integer common factor, $N_U$, as shown in Relationship (2), below, wherein $D_{LC}$ is the least common denominator of the fraction.

$$N_u/2D=N_u/(N_u(2*D_{LC}))=1/(2D_{LC}) \tag{2}$$

Note the factor of 2D is used instead of D, since D represents π, and a full cycle (rising edge to rising edge) requires (2*π) radians (two transitions). For unary ratios, there is no quantization jitter. For non-unary ratios, the minimum quantization jitter frequency is $F_R/(2D_{LC})$. For unary ratios, the average output pulse rate is equal to the instantaneous rate, and there is no phase quantization jitter. The relationship between N/D and I+R/M is shown in relationships (3), (4), and (5) below.

$$I+(R/M)=D/N \tag{3}$$

such that:

$$I=trunc(D/N) \tag{4}$$

$$R/M=drem(D/N) \tag{5}$$

where D, N, I, R, & M are all integers, trunc is the integer result of the largest long division, and drem is the remainder. Thus, M is the modulus of the FIRM synthesizer. Numbers for I, R, & M that are equivalent to unary ratios for N/2D are any numbers such that R/M=0 or ½.

Figure 9B:
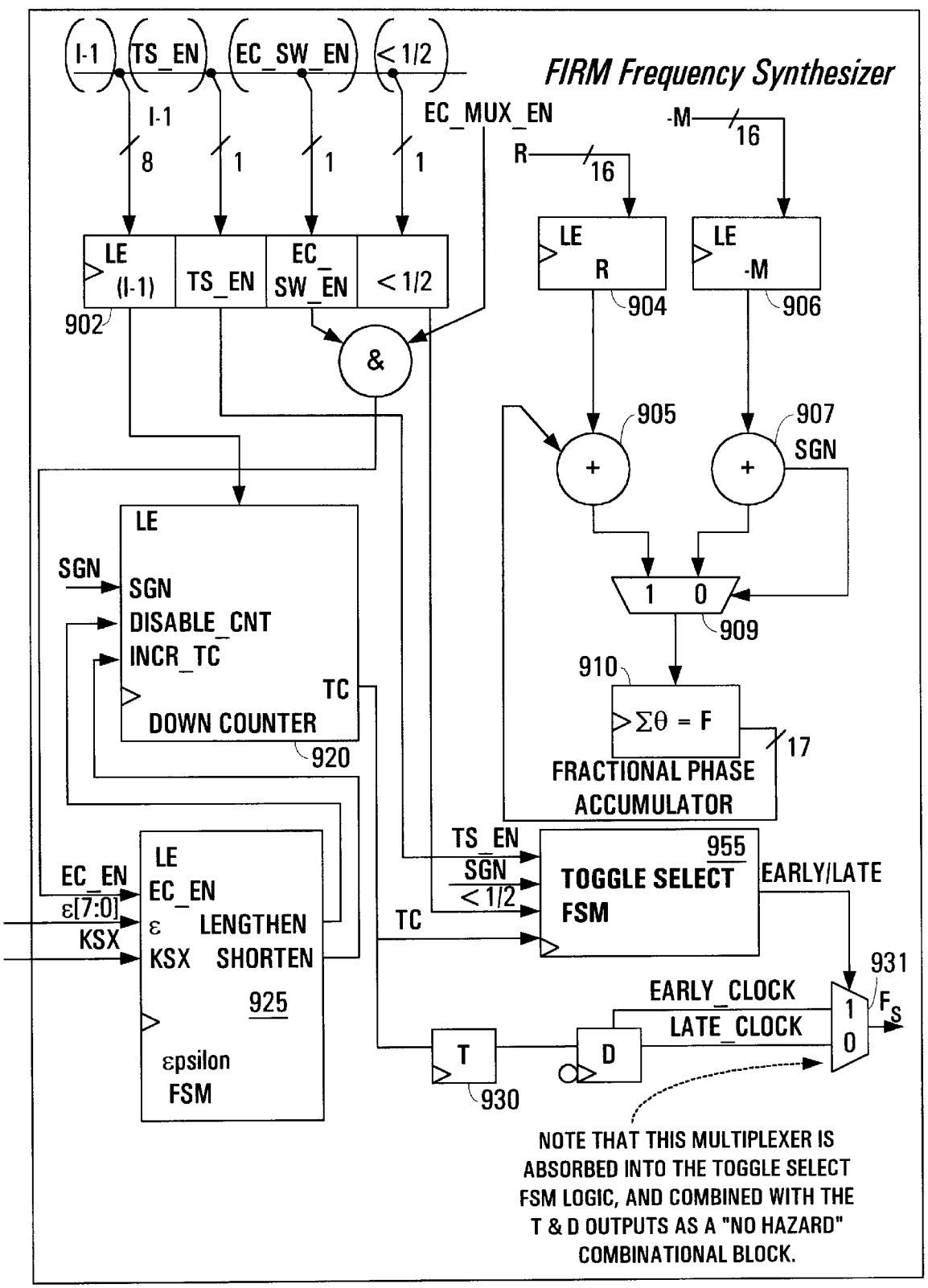
FIG. 9B shows a block diagram of an exemplary FIRM (integer remainder modulus) frequency synthesizer according to the present invention.

With reference to FIG. 9B, an internal circuit block diagram is shown of an exemplary FIRM frequency synthesizer 900 according to the present invention. The exemplary FIRM frequency synthesizer 900 can be used to implement the FIRM frequency synthesizers 840, 842, 844, 846 of FIG. 8. An "I−1" register 902 receives an (I−1) integer signal. In a preferred embodiment of the present invention, the (I−1) integer signal is an eight bit signal. An "R" register 904 receives a 16 bit remainder signal. An "−M" register 906 receives a 16 bit input signal.

With reference still to FIG. 9B, a first FIRM adder 905 includes a first input which is coupled to receive a latched remainder signal from an output of the "R" register 904. The first FIRM adder 905 has a second input which is coupled to receive an output of a fractional phase accumulator 910. A second FIRM adder 907 includes a first input which is coupled to receive a latched signal from an output of the "−M" register 906. The second FIRM adder 907 also has a second input which is coupled to receive an output of the first FIRM adder 905. A multiplexer 909 has a first input which is coupled to receive the output of the first FIRM adder 905. Multiplexer 909 also has a second input which is coupled to receive a signal from a first output of the second FIRM adder 907. The FIRM multiplexer 909 has a select input which receives a SGN signal from a second output of the second FIRM adder 907. The fractional phase accumulator 910 is coupled to receive an output signal from multiplexer 909. Each element of the exemplary FIRM frequency synthesizer 900 of FIG. 9B is synchronized to the reference frequency input, $F_r$, which is selected by means of software control.

A toggle select finite state machine (toggle select FSM) 955 provides time domain phase-noise shaping for the FIRM output clock signal, Fs. The toggle select FSM 955 reduces the magnitude of the phase quantization due to the finite rate of the reference dock by a factor of two, and at the same time doubles the frequency of the fundamental of the phase noise jitter spectrum. Doubling the frequency of the fundamental results in a spreading of the jitter spectrum, while halving the magnitude reduces the jitter modulation potential of the fundamental, and each of its harmonic by 6 dB. the combination of spreading the spectrum and reducing the magnitude reduces the RMS jitter modulation potential per unit bandwidth by 12 dB. The toggle select FSM 955 selects between a direct (rising edge) output of the toggle flip lop (930) and a half cycle (falling edge) delayed version of that same signal. toggle select enable (TS_EN) signal is provided to the toggle select FSM 955. A SGN bit is provided to indicate "lengthened cycles," i.e. the integer counter 920 will count one extra reference clock before generating a terminal count signal (TC signal) for the next output clock cycle. A TC bit indicates the terminal count of the integer counter 920, the indication that the next reference clock rising edge will cause a toggle. Another input to the Toggle Select FSM, "<½" indicates that the value of R/M is less than ½. An output of the Toggle Select FSM 915 is the multiplexer select. The multiplexer select, EARLY_CLOCK, and LATE_CLOCK signals are combined to form a "no hazard" combinational logic circuit (931).

Several sample timing diagrams are presented below in which cases of various ratios of R to M are shown with corresponding EARLY/LATE signals, EARLY_CLOCK/LATE_CLOCKS, and OUTPUT clocks. In all of these examples, the value of the integer divider shown is 4.

Figure 9C:
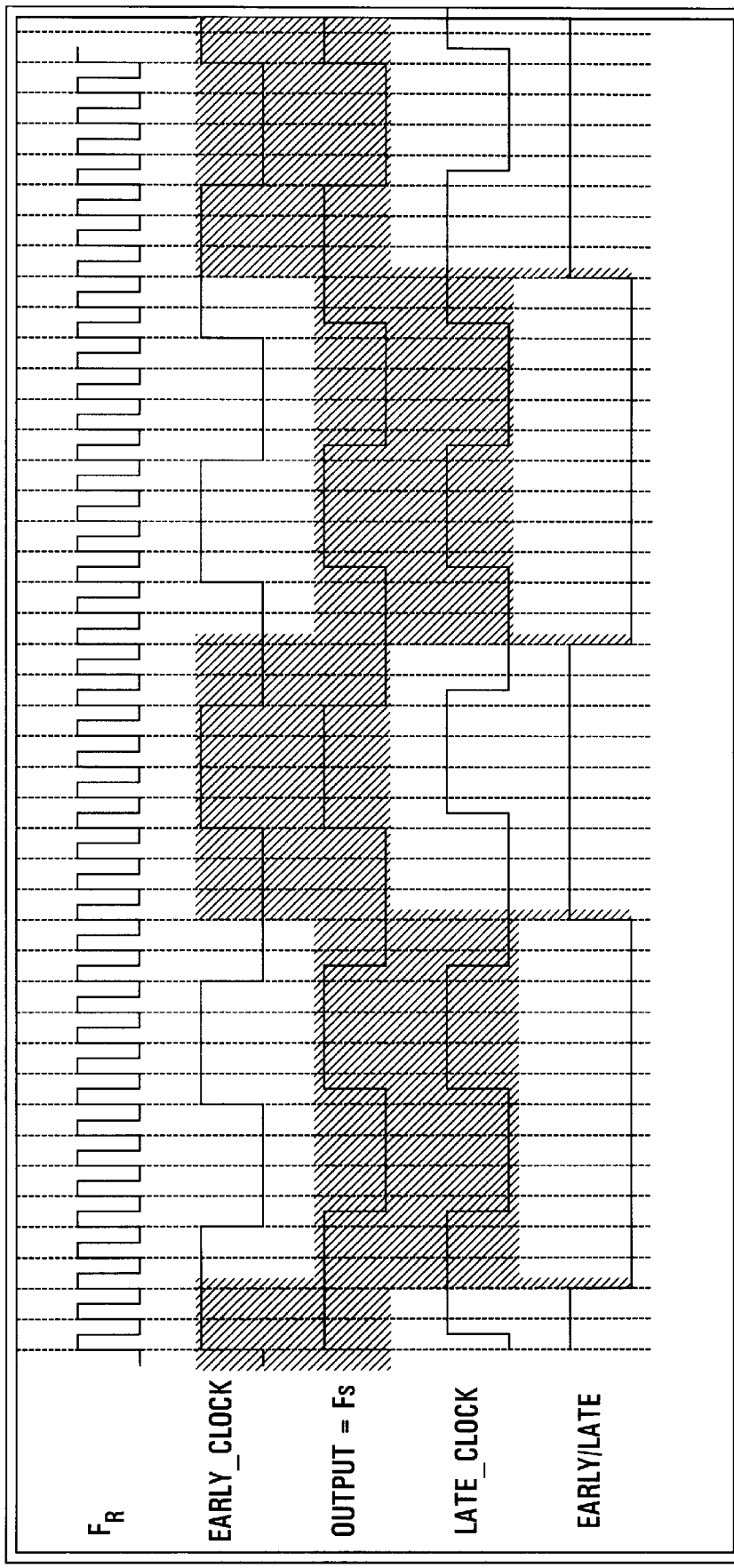
FIG. 9C shows a FIRM frequency synthesizer output timing diagram shown for D/N=4+1/5==>R=1, M=5, which also demonstrates how the jitter reduction mechanism operates.
Figure 9D:
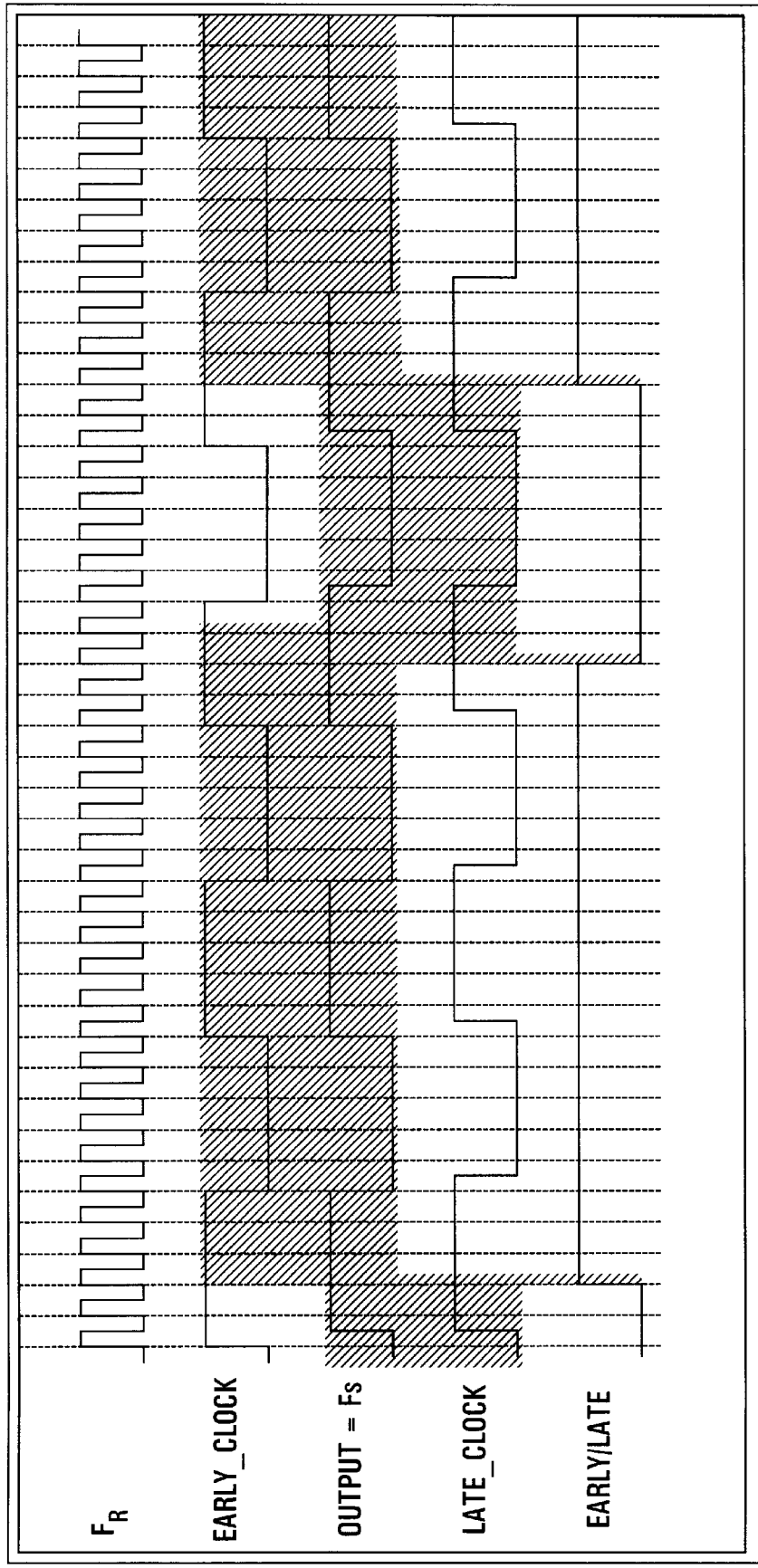
FIG. 9D shows a FIRM frequency synthesizer output timing diagram for D/N=4+4/5==>R=4, M=5, which also demonstrates how the jitter reduction mechanism operates.
Figure 9E:
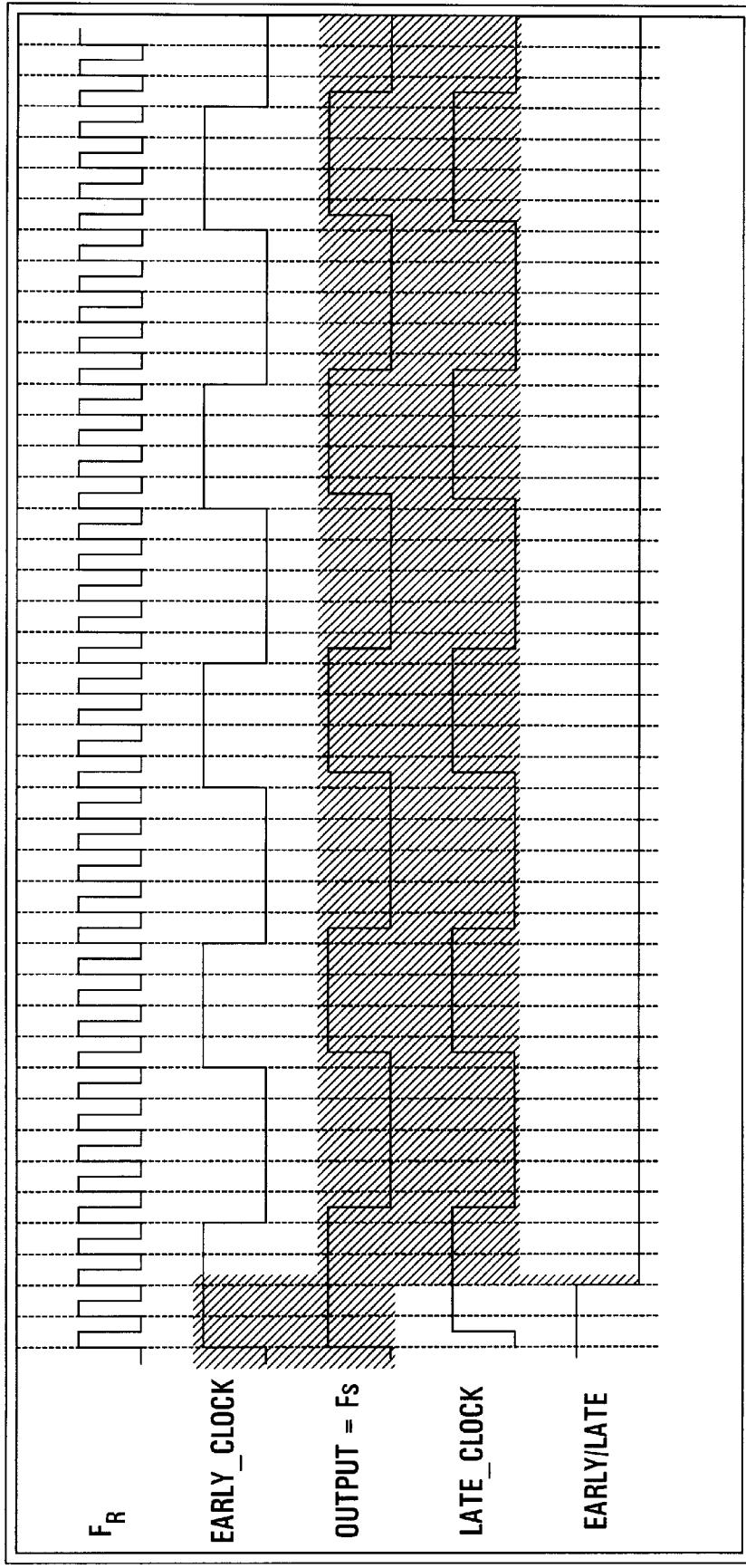
FIG. 9E shows a FIRM frequency synthesizer output timing diagram for D/N=4+1/2==>R=1, M=2, which also demonstrates how the jitter reduction mechanism operates.

With reference to FIG. 9C, for R/M=⅕, the majority of the output clock edges are selected from the LATE_CLOCK. In general, values of R/M<½ exhibit this behavior. With reference to FIG. 9D, for R/M =⅘, the majority of the output dock edges are selected from the EARLY_CLOCK. In general, values of R/M>½ exhibit this behavior. With reference to FIG. 9E, for these values of R/M=½, there is no phase quantization error and the toggle select FSM 905 can continually choose one clock, in this particular implementation, the late dock.

Figure 10A:
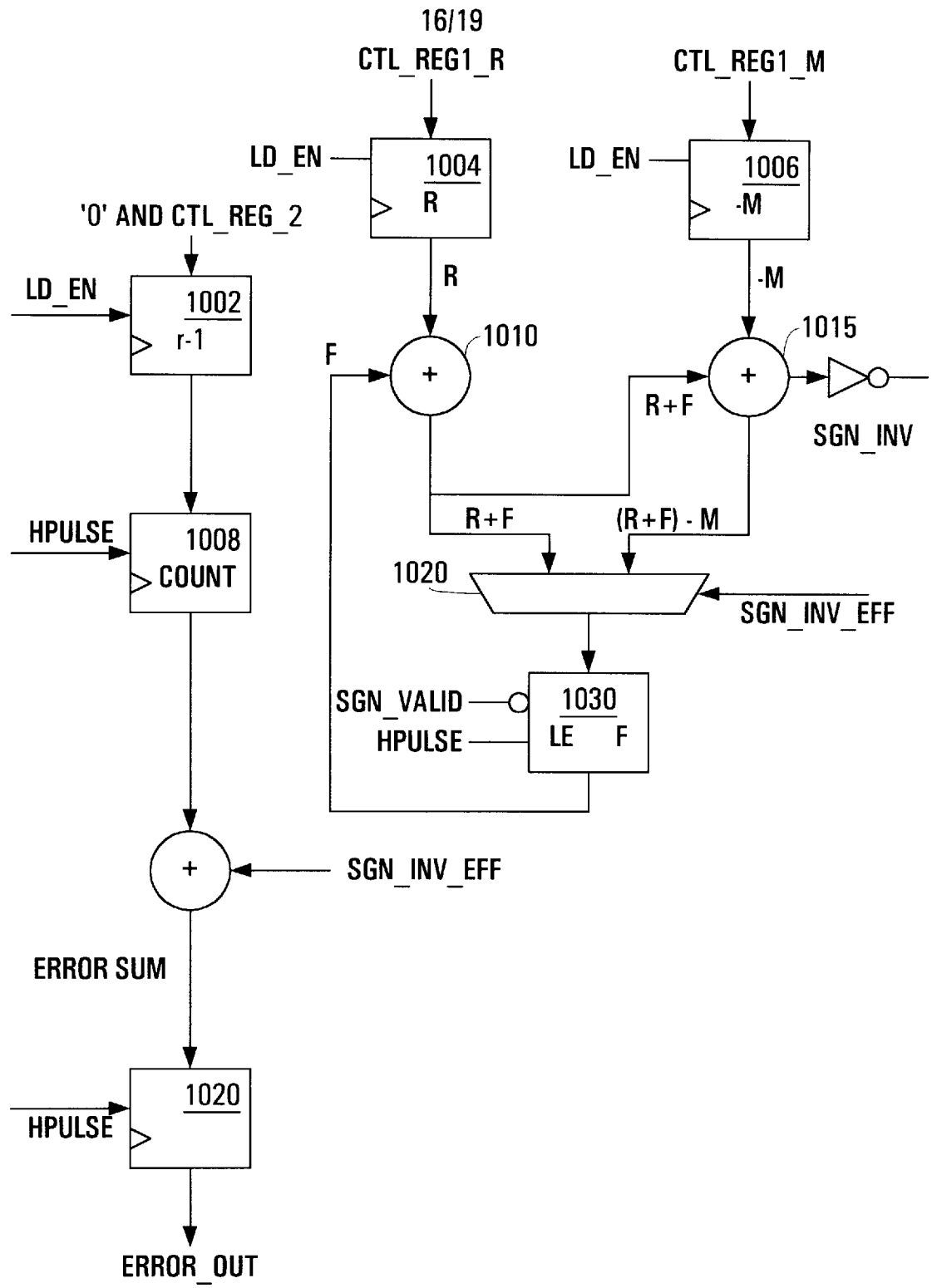
FIG. 10A shows an inner circuit block diagram of an exemplary video synchronization synthesizer circuit according to the present invention.
Figure 10B:
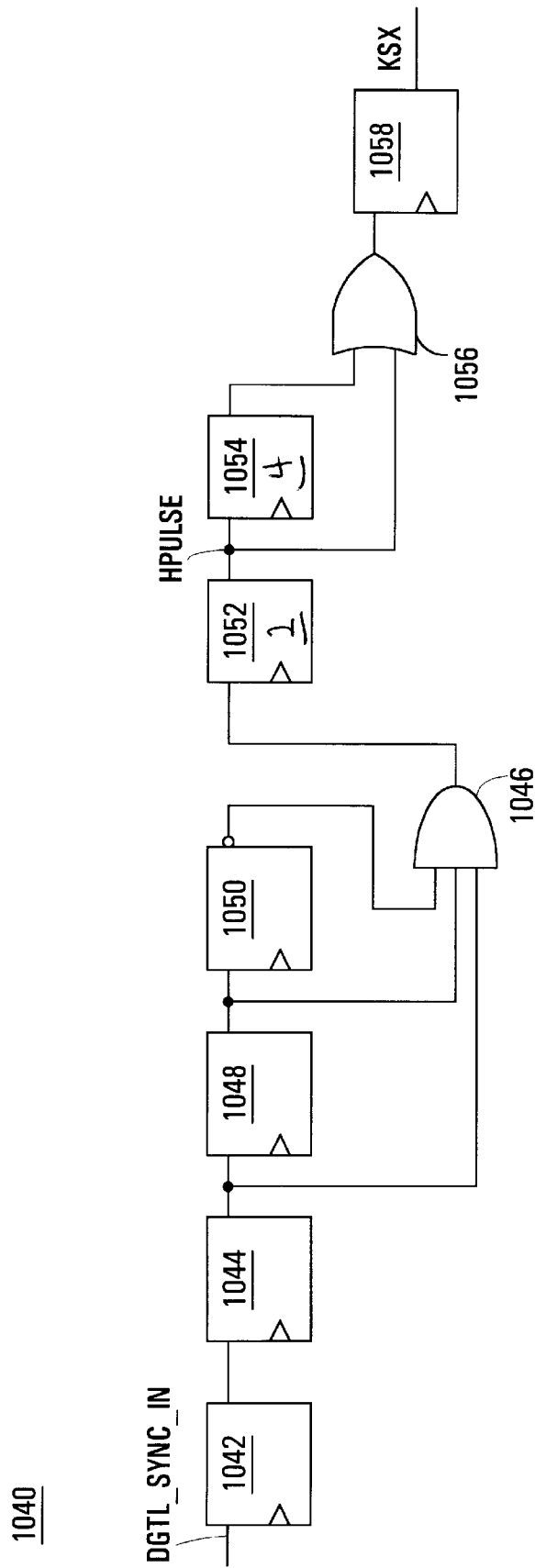
FIG. 10B shows a DGTL_SYNC_IN receive circuit for a video synchronization synthesizer circuit according to the present invention.
Figure 10C:
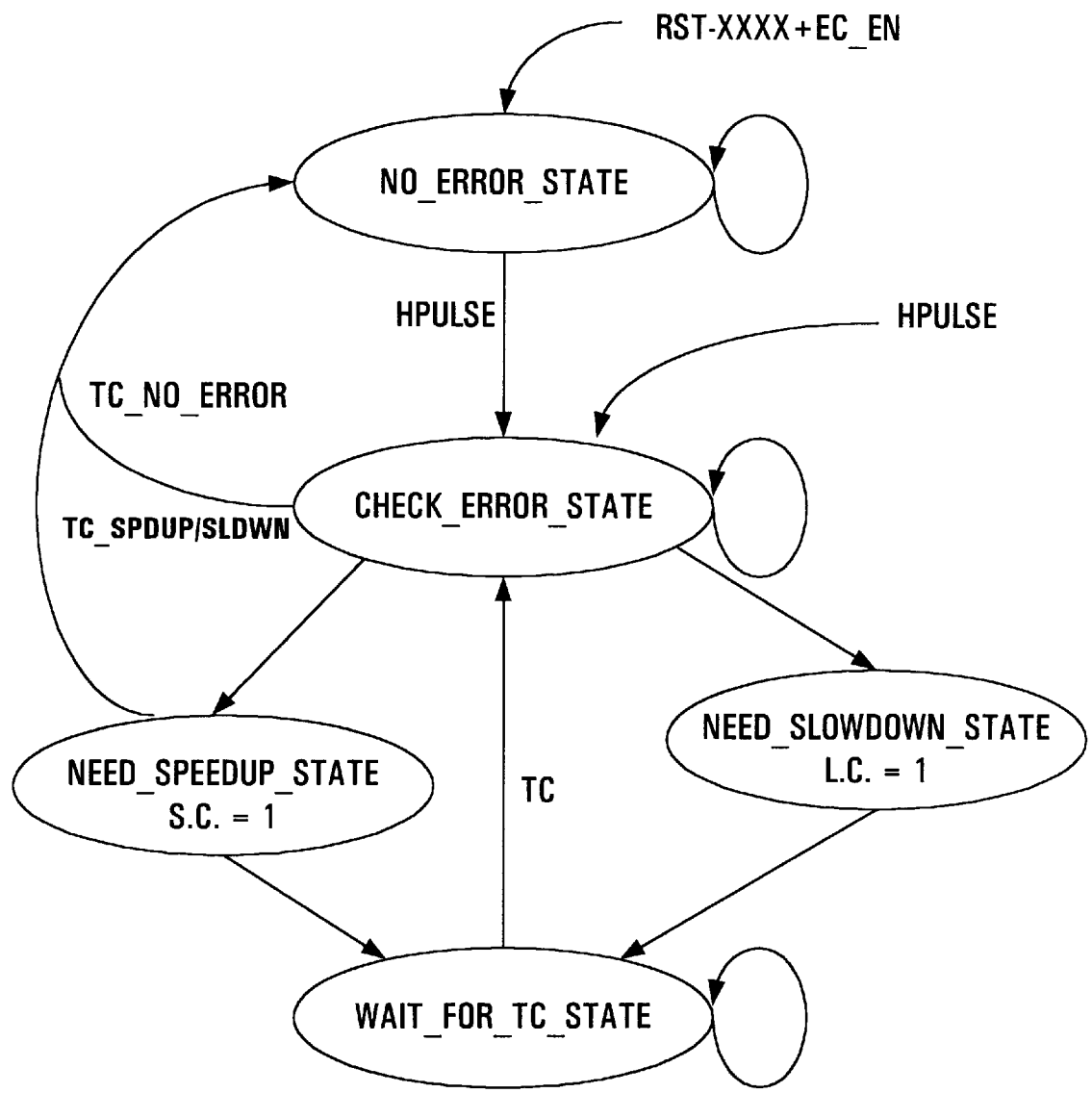
FIG. 10C shows a state diagram for how the KSYNC synchronization synthesizer's error values can be used to adjust the output of frequency synthesizers.

With reference to FIGS. 10A, 10B, and 10C, a diagram is shown of an exemplary video synchronization synthesizer circuit 1000 and associated circuitry according to the present invention. The exemplary video synchronization synthesizer circuit 1000 can be used to implement the first and second video synchronization synthesizers 810, 812 of FIG. 8. The exemplary video synchronization synthesizer circuit 1000 contains a multiplicity of registers. One of the oscillator clock input signals, OSC_CLK_0 and OSC_CLK_1, is used as the dock for each register in the exemplary video synchronization synthesizer circuit 1000. OSC_CLK_0 is used as the clock for each register in the first video synchronization synthesizer 810. OSC_CLK_1 is used as the clock for each register in the second video synchronization synthesizer 812.

With reference to FIG. 11A, the exemplary video synchronization synthesizer circuit 1000 includes an "I−1" register 1002, an "R" register 1004, and an "−M" register 1006. The use of these registers in the video synchronization circuits is very similar to the use of the corresponding "I−1", "R", and "−M" registers in the FIRM frequency synthesizers 840, 842, 844, 846. The "I−1" register 1002 receives from CTL-REG2 an input signal representative of an integer component of one less than the number of oscillator clock periods expected between each rising edge of the DGTL_SYNC_IN signal.

The "R" register 1004 receives a 16 bit input signal from CTL-REG1_R representative of a numerator of a fractional component of the number of oscillator clock periods expected between each rising edge of the DGTL_SYNC_IN signal. The "−M" register 1006 receives a 16 bit input signal form CTL-REG1_M representative of a denominator of the fractional component of the number of oscillator dock periods expected between each rising edge of the DGTL_SYNC_IN signal.

With reference still to FIG. 10A, a first adder 1010 includes a first input which is coupled to receive a latched remainder signal from an output of the "R" register 1004. The first adder 1010 has a second input which is coupled to receive an output of a fractional phase accumulator 1030. A second adder 1015 includes a first input which is coupled to receive a latched modulus signal from an output of the "−M" register 1006. The second adder 1015 also has a second input which is coupled to receive an output of the first adder 1010. A multiplexer 1020 has a first input which is coupled to receive the output of the first adder 1010. The multiplexer 1020 also has a second input which is coupled to receive a signal from a first output of the second adder 1015. The multiplexer 1020 has a select input which receives a SGN_INV_EFF signal from a second output of the second adder 1015. The fractional phase accumulator 1030 is coupled to receive an output signal from the multiplexer 1020. The fractional phase accumulator 1030 keeps track of the numerator of the fractional component. Flip-flop 1030 is cleared when SGN_VALID is "O" and loads with HPULSE. A down counter 1008 receives an output signal from the "I−1" register. The down counter 1008 loads it "I−1" when HPULSE is "1". The ERROR_OUT register 1020 is a function of ERROR_SUM and HPULSE signals.

With reference to FIG. 10B, a DTGL_SYNC_IN receive circuit 1040 is shown. The DTGL_SYNC_IN receive circuit 1040 includes seven registers. The DGTL_SYNC_IN receive circuit 1040 is a sub circuit of the video synchronization synthesizer circuit 1000. A first DTGL_SYNC_IN register 1042 receives the DGTL_SYNC_IN signal. A second DGTL_SYNC_IN register 1044 receives a signal from an output of the first DTGL_SYNC_IN register 1042. An output signal from the second DGTL_SYNC_IN register 1044 is provided to a first input to an AND gate 1046 and also to an input to a third DTGL_SYNCIN register 1048. The third DTGL_SYNC_IN register 1048 provides an output signal to a second input to the AND gate 1046. A fourth DGTL_SYNC_IN register 1050 has an input which receives the output signal from the third DGTL_SYNC_IN register 1048. The fourth DTGL_SYNC_IN register 1050 provides an inverted output signal to a third input to the AND gate 1046. The AND gate 1046 checks inverted output signal to determine whether the DGTL_SYNC_IN signal is high for two clock cycles. The AND gate 1046 provides an output signal to a fifth register 1052.

An output of the fifth register 1052 provides a HPULSE signal. The HPULSE signal is a horizontal video dock rate component of the DGTL_SYNC_IN signal. A sixth register 1054 includes an input which is coupled to receive the HPULSE signal. A first input to an OR gate 1056 is coupled to receive the HPULSE signal. A second input of the OR gate 1056 is coupled to receive an output from the sixth register 1054. A seventh register 1058 is coupled to receive an output signal from the OR gate 1056. An output of the seventh register 1058 provides the KSX control signals. KSX0 KSX1 are the KSX outputs of their respective video sync synthesizers.

Figure 10D:
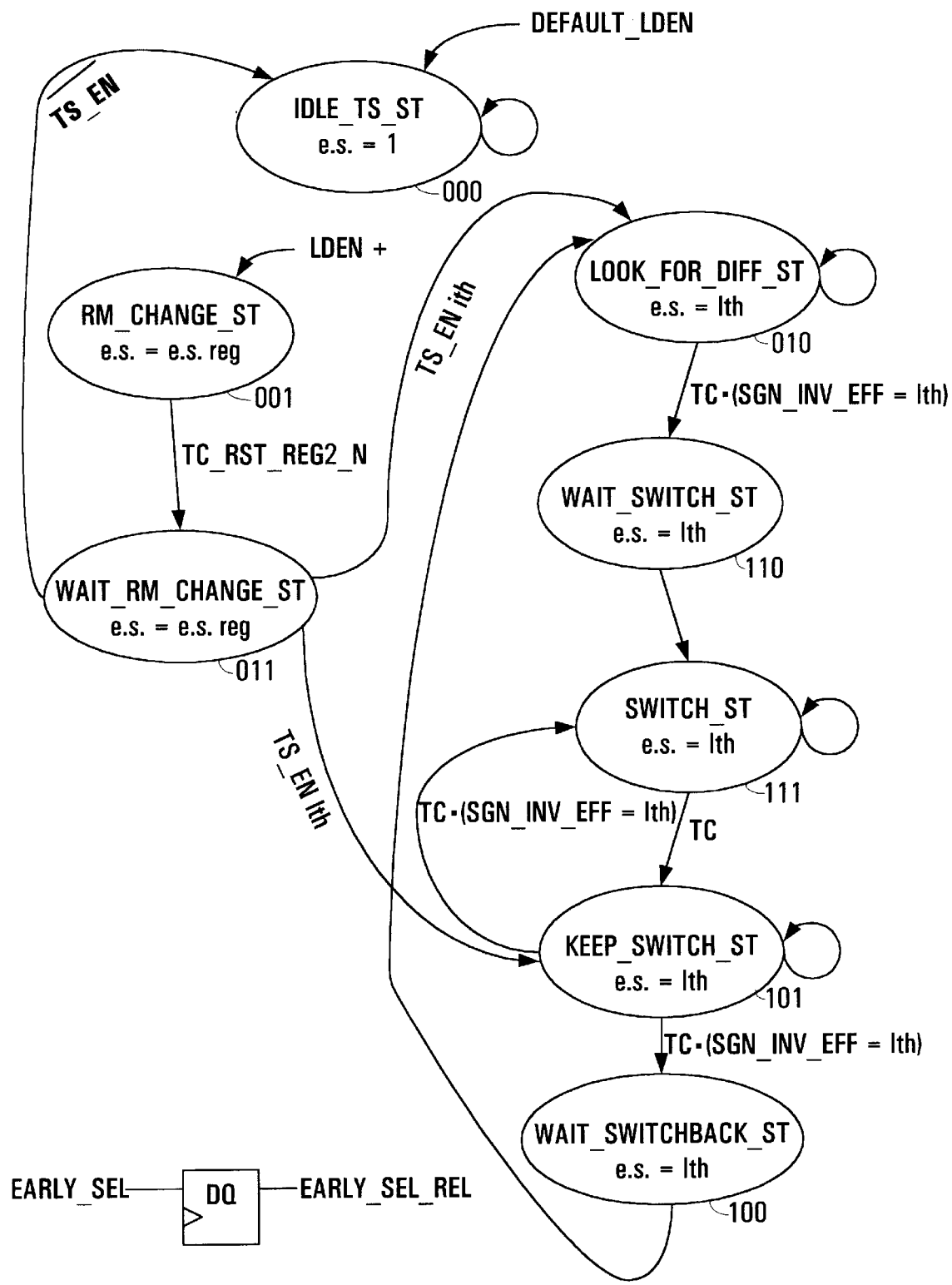
FIG. 10D shows an input toggle select finite state machine diagram.

With reference to FIG. 10C, a finite state machine is shown for synchronizing to video by using Eo and KSX values. FIG. 10D shows an input toggle select finite state machine diagram.

With reference back to FIG. 8, three examples are presented for operating the clock generator circuit 700 of the present invention. A first example is for free-running analog output (D to A) operation referenced to an on-board crystal oscillator for output. For free-running operation select either OSC_CLK_0, or OSC_CLK_1 as the frequency reference for the FIRM synthesizer. The setting of the FIRM synthesizer should be set to exactly 256x the desired sample rate. For instance, 12.288 MHz for a desired rate of 48 KHz. The values of I, R&M for the case of a 98.304 MHz reference clock would simply be I=4, R=0, and M=0 (or don't care), for a D-to-A rate of 48 KHz; 1=24, R=0, and M=1000, for a D-to-A rate of 48.952 KHz, and so on. The output of the desired FIRM synthesizer is selected to clock generator output multiplexer #2 (the D-to-A output multiplexer). A D-to-A Range setting is selected such that the CONV clock to the D-to-A is running at from 512x, to 1024x the desired sample rates for the D-to-A.

A second example is for referencing the AES input as a synchronization source, and running the A to D input at a FIRM rate relative to that frequency reference. In this case, the MPLL1 is selected as the source for the FIRM synthesizer. The dock rate of MPLL1 is set to 8x the AES 256x clock (or 2048x the 1x audio sample rate). This yields a dock which tracks the AES input frequencies of 30 KHz to 102.400 MHz. If the AES input was running at a 48 KHz lx rate, the 8x 256x MPLL1 output dock would run at 98.304 MHz; So, if the desired rate of the A-to-D was to be 44.1 KHz sochronous to the AES input, FIRM would need to be set to I=4, R=52, and M=147. The A-to-D clock sourced from output multiplexer 870 is selected.

The third example is for running digital output via ADAT frame-locked to the AES digital input. To run the ADAT frame locked to the AES input, the frequency synthesizers are bypassed by setting the ADAT output multiplexer 876 to select the AES11x256 signal and the AES11 WCLK signal. In this case, the ADAT output multiplexer 876 outputs to the ADAT 256x and FSYNC signals respectively. ADAT frame synchronization runs at the same rate as AES word clock.

An introduction to rational fractions is now presented. It is very easy to describe some of the interesting digital media rates as a single number. For example, the standard sampling frequency for CD audio is 44.1 kHz, exactly. Some other rates, and relations between them, do not succumb so easily to precise representation. For example, the number of seconds that elapse during the nominal time of an NTSC video frame can not be represented exactly with a finite number of digits in decimal form. One can show the number in decimal form, as 0.0333666, with the bar over the last 6 indicating that the more 6's we place on the end of the representation, the closer one becomes to describing the value exactly. Unfortunately, with a finite string of digits, one can never manage to get exactly the right value. In many cases where such numbers are used, a single value description in decimal (or binary, or octal, etc.) form provides an adequate precision to the task at hand-the size of numerical error is bounded and very well understood. In other cases, one may need or want to use truly exact relationships. (e.g. it may be easier to maintain exact relationships than to perform error analysis). In mathematics, there is a convenient and exact representation for quantities such as the one described above: rational fractions. A rational fraction is a ratio between two integers, and is easily represented as just that—a pair of integers. An exact representation for the nominal NTSC frame time is 1001/30000 seconds: (1/(30x 1000/1001)).

The present invention exploits properties of rational fractions to describe and manipulate digital media rates and relationships between them. Of particular interest are rational fractions in which both the numerator and denominator are positive integers. (Positive integers are also called "natural numbers".) One property of rational fractions would prove troublesome; there are an infinite number of rational fractions that describe the same quantity. The quantity described above can not only be expressed as 1001/30000, but also 2002/60000, or for that matter, 300300/9000000, and so on. Fortunately, one can state that only one "reduced" rational fraction exists to represent this particular value. A reduced fraction is one where no common factor, other than 1, remains. That is, the numerator and denominator are not both evenly divisible by any natural number other than 1. In general, our work with rational fractions will assume that they are reduced. In the example above, 1001/30000 is the only reduced rational fraction that exactly describes the quantity.

Alternative Representation of Rational Fractions corresponding to the Lp vector is described. Each positive integer can be alternatively represented as a decomposition, or factoring, into a multiplication of prime numbers called its "prime factorization". For example, the CD audio sample rate is:

44.1 kHz=44100 Hz=2*2*3*3*5*5*7*7*7 Hz

When the numerator and denominator of reduced rational fractions is represented as their prime factorizations, some interesting properties come to light. For example, the period of an NTSC frame is:

1001/30000 seconds -=7*11*13/2*2*2*2*3*5*5*5*5

The numerator and denominator are always relatively prime; the same prime number factor in both the numerator and the denominator will never occur. For digital media, it turns out that the number of prime factors necessary to cover all of the standard digital audio and video professional rates, and their relationships, is small-only 6. That is, the prime numbers 2,3,5,7,11,13 are all of the prime factors required. In order to take advantage of these and other properties, a new representation for rational fractions, Lp, is introduced. The elements of Lp represent the integer exponents of the prime factors of a reduced rational fraction. Lp is constructed as a list of exponents of the prime numbers in ascending order, starting with 2. A particular size of Lp will be required or convenient for some computations; this is denoted as Lpn, where n is the number of elements.

The following definitions apply to the present invention. R is a non-zero, positive, reduced, rational fraction. Lp is a vector of finite size. Each of its elements is an integer. lp(R) is a function that generates the vector Lp. Informally represent lp(R) as Lp(R). r(Lp) is a function that generates a rational fraction R A capsule summary is that R=r(Lp(R)). In short, one can move back and forth between equivalent descriptions of rational fractions, and one of these descriptions of rational fractions, and one of these descriptions is Lp. Properties of Lp vectors are given below.

Lp vectors have properties similar to logarithms hence the L notation):

Lpn(Ra)+Lpn(Rb)=Lpn(Ra*Rb)

Addition in the Lp domain is equivalent to multiplication of the corresponding rational fractions.

Lpn(Ra)−Lpn(Rb)=Lpn(Ra/Rb)

Subtraction in the Lp domain is equivalent to division of the corresponding rational fractions. The result of addition and subtraction of Lp vectors is always as Lp vector.

Mapping Lp Vectors to FIRM parameters is now described: Two systems in the RAD chip, an ASIC implementation of this system, require programming by means of "FIRM" parameters: The audio clock rate generators (known as FIRM frequency synthesizers), and, The video synchronization synthesizer in conjunction with a FIRM synthesizer. The mathematics used to generate the parameters is the same for both. These derive output clocks from higher-rate input docks. The ratio of input to output clocks is a rational fraction, represented as D/N wherein D greater than N. The programmed parameters are I−1, R, and −M, which are an equivalent representation of rational fractions as: D/N=I+R/M, wherein I is the integer result of the division, and R/M is the fractional remainder. The first step is to generate the values of D and N by taking advantage of the properties of Lp as above, or through other means. I, R, and M follow easily by simple operations. Fortunately, there is mathematical proof that if D and N are relatively prime (which they are, recalling that D/N is a reduced rational fraction), then (D modulo N) and N are also relatively prime, hence reduced. The R/M fractional remainder will require no further factoring.

Parameters for the video synchronization synthesizers are now described in detail. The KSync synthesizer is programmed with the ratio between nominal line rate for the video standard of interest, and, the relevant audio master dock source rate, 2048×Fs, where Fs is either 44.1 kHz or 48 kHz. The 2048×Fs master dock is (also) the source of clocks to the associated audio dock rate FIRM frequency synthesizer. That is, the KSync synthesizer I+(R/M) values correspond to the number of 2048×Fs clocks that nominally occur in one video horizontal timing interval.

D/N=I+r/m=2048×Fs/Fh, where Fh is the video horizontal rate.

Using Lp representations,

Lp6(KSync)=Lp6(2048)+Lp6(Fs)−Lp6(Fh)

[11 0 0 0 0 0]=Lp6(2048)
[4 2 6 0 −1 −1]=Lp6(FhNTSC)
[0 0 6 0 0 0]=Lp6(ThPAL)
[2 2 2 2 0 0]=Lp6(44.1 kHz)
[7 1 3 0 0 0]=Lp6(48 kHz)

There are four basic set-ups: NTSC and 48 kHz, NTSC and 44.1 kHz, PAL and 48 kHz, and PAL and 44.1 kHz.

Table 2, Video Synchronization Synthesizer Parameter Values, below, shows results summarized, with the resulting values of D, N, I, r, and m. Using the same procedure, appropriate results can be generated for true 30 Hz video frames, or, other 2048×F's audio clock sources.

TABLE 2

KSYNC Synthesizer Parameter Values

| Relation | Lp6 | D | N = m | I | R |
| --- | --- | --- | --- | --- | --- |
| NTSC, 48 KHz | [14-1-3011] | 2342912 | 375 | 6247 | 287 |
| NTSC, 44.1 KHz | [90-4211] | 3587584 | 625 | 5740 | 84 |
| PAL, 48 KHz | [181-3000] | 786432 | 125 | 6291 | 57 |
| PAL, 44.1 KHz | [132-4200] | 3612672 | 625 | 5780 | 172 |

Next, the parameters for programming the FIRM Frequency Synthesizer for some "unary" rates are described in detail. The FIRM Frequency Synthesizer is programmed with the ratio between 512×F, where F is the desired audio clock rate, and, the relevant audio master clock source rate, $F_r$=2048×$F_m$, where Fs is either 44.1 kHz or 48 kHz.

D/N=I+R/M=(2048×Fs)/(512*Fa)

or in other terms:

Lp6(FIRM)=(Lp6(2048)+Lp6(Fs))−(Lp6(512)+Lp6(Fa))

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A clock generator that outputs a plurality of clock signals, each of the clock signals having different frequencies and which are capable of being synchronized to one of a plurality of reference signals, comprising:

a synchronization circuit for generating a digital synchronization signal;

a measurement circuit coupled to the synchronization circuit for determining a difference signal indicating a rate difference between a nominal rate of the digital synchronization signal and an actual rate of the digital synchronization signal with respect to a reference clock;

a plurality of frequency synthesizers coupled to the measurement circuit for generating the clock signals, wherein each of the frequency synthesizers modifies its output clock signal based on the difference signal and maintains a rational relationship between the frequencies of the clock signals and the frequency of the digital synchronization signal.

2. The clock generator of claim 1 further comprising a phase-lock-loop circuit coupled after the frequency synthesizers which is crystal referenced.

3. The clock generator of claim 1, wherein the digital synchronization signal corresponds to a video horizontal line rate.

4. The clock generator of claim 1, wherein a frequency synthesizer divides a reference clock signal by an integer I value and a ratio R/M value to generate an output clock signal, wherein the I R, and M values are predetermined and stored in a register and wherein the ratio comprises a remainder numerator and a modulus denominator.

5. The dock generator of claim 4, wherein there are, on average, I+(R/M) input dock transitions per output dock transition.

6. The clock generator of claim 4, wherein edges of the clock transitions are quantized to edges of the reference clock.

7. The dock generator of claim 1 further comprising a jitter reduction mechanism coupled to the frequency synthesizers for reducing phase quantization due to the finite rate of the reference clocks.

8. The clock generator of claim 7, wherein the jitter reduction mechanism doubles the frequency of the fundamental of a phase noise jitter spectrum in order to spread the jitter spectrum while halving a magnitude.

9. The clock generator of claim 7, wherein logic associated with implementing the jitter reduction mechanism operates at the same rate as that of the reference clock.

10. The clock generator of claim 7, wherein the jitter reduction mechanism selects between a direct output of a frequency synthesizer and a delayed version of the direct output.

11. The clock generator of claim 10, wherein the delayed version of the direct output is delayed by approximately half of a reference clock period.

12. In a computer system, a method for generating a plurality of clock signals, each of the clock signals having different frequencies and which are capable of being synchronized to one of a plurality of reference signals, comprising the steps of:

generating a digital synchronization signal corresponding to a digital media stream;

determining a difference signal corresponding to a rate difference between a nominal rate of the digital synchronization signal and an actual rate of the digital synchronization signal with respect to a reference clock;

adjusting output clock signals of a plurality of frequency synthesizers based on the difference signal;

maintaining a rational relationship between the frequency of the output clock signals and the frequency of the digital synchronization signal.

13. The method of claim 12 further comprising the step of performing a phase-lock-loop circuit after the clock has been generated.

14. The method of claim 12, wherein the digital synchronization signal corresponds to a video horizontal line rate.

15. The method of claim 12 further comprising the step of dividing a reference signal by an integer I value and a ratio R/M value to generate an output clock signal, wherein the I, R, and M values are predetermined and stored in a register and wherein the ratio comprises a remainder numerator and a modulus denominator.

16. The method of claim 15 further comprising the step of quantizing edges of the clock transitions to edges of the reference clock.

17. The method of claim 15 further comprising the step of outputting, on average, one output clock transition per I+(R/M) input clock transition.

18. The method of claim 17 further comprising the step of operating a jitter reduction mechanism at the same rate as that of the reference clock.

19. The method of claim 12 further comprising the step of reducing phase quantization due to the finite rate of the reference clocks by doubling the frequency of the fundamental of a phase noise jitter spectrum by spreading the jitter spectrum.

20. The method of claim 19 further comprising the step of selecting between a direct output of a frequency synthesizer and a delayed version of the direct output.

21. The method of claim 20 further comprising the step of delaying the delayed version of the direct output by approximately half of a reference clock period.

* * * * *